United States Patent
Kohno

(10) Patent No.: US 6,310,811 B1
(45) Date of Patent: Oct. 30, 2001

(54) MEMORY WITH HIGH SPEED READING OPERATION USING A SWITCHABLE REFERENCE MATRIX ENSURING CHARGING SPEED

(75) Inventor: Takaki Kohno, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/484,699

(22) Filed: Jan. 18, 2000

(30) Foreign Application Priority Data

Jan. 29, 1999 (JP) .................................... 11-022513

(51) Int. Cl.$^7$ ...................................................... G11C 7/02
(52) U.S. Cl. ...................... 365/210; 365/203; 365/230.03
(58) Field of Search ..................................... 365/210, 203, 365/207, 204, 185.2, 185.25, 230.03

(56) References Cited

U.S. PATENT DOCUMENTS

| | | | | |
|---|---|---|---|---|
| 5,734,619 | * | 3/1998 | Numata | 365/203 |
| 5,943,286 | * | 8/1999 | Orita | 365/230.03 |
| 6,055,175 | * | 4/2000 | Kang | 365/210 |

FOREIGN PATENT DOCUMENTS

| | | |
|---|---|---|
| 4-311900 | 11/1992 | (JP) . |
| 9-266294 | 10/1997 | (JP) . |
| 10-269789 | 10/1998 | (JP) . |
| 10-269790 | 10/1998 | (JP) . |
| 11-96780 | 4/1999 | (JP) . |

* cited by examiner

*Primary Examiner*—A. Zarabian
(74) *Attorney, Agent, or Firm*—McGinn & Gibb, PLLC

(57) ABSTRACT

A semiconductor memory device includes a memory cell matrix section, a reference memory cell matrix section and a sensing circuit. The memory cell matrix section includes memory cells arranged in a first matrix. When one of the memory cells is selected based on an address signal, a read data signal corresponding to a storage data of the selected memory cell is outputted. The reference memory cell matrix section includes reference memory cells arranged in a second matrix, and outputs a reference data signal for the read data signal from the selected memory cell. The sensing circuit senses the storage data based on the read data signal from the memory cell matrix section and the reference data signal from the reference memory cell matrix section. At this time, the reference memory cell matrix section outputs the reference data signal to the sensing circuit such that the reference data signal appears in substantially synchronous with the data read signal.

16 Claims, 30 Drawing Sheets

TO PRECHARGE LINE PC

Fig. 8 PRIOR ART

| AD | a2 | a1 | a0 | CEL | BS6 | BS5 | BS4 | BS3 | BS2 | BS1 | D0 | VG1 | D1 | D2 | VG2 | D3 | D4 | VG3 | PAT |
|---|---|---|---|---|---|---|---|---|---|---|---|---|---|---|---|---|---|---|---|
| 0 | 0 | 0 | 0 | 7 | 0 | 0 | 0 | 1 | 0 | 1 | - | - | - | 1 | 0 | 1 | 1 | 1 | 2 |
| 1 | 0 | 0 | 1 | 6 | 0 | 0 | 0 | 1 | 1 | 0 | - | 1 | - | 1 | 0 | 1 | - | - | 1 |
| 2 | 0 | 1 | 0 | 4 | 0 | 0 | 1 | 0 | 0 | 1 | - | 1 | 1 | 1 | 0 | - | - | 1 | 2 |
| 3 | 0 | 1 | 1 | 5 | 0 | 0 | 1 | 0 | 1 | 0 | - | - | 1 | 1 | 0 | 1 | 1 | 1 | 2 |
| 4 | 1 | 0 | 0 | 3 | 0 | 1 | 0 | 0 | 0 | 1 | - | 1 | 1 | 1 | 0 | - | - | 1 | 1 |
| 5 | 1 | 0 | 1 | 2 | 0 | 1 | 0 | 0 | 1 | 0 | - | - | - | 1 | 0 | 1 | - | - | 2 |
| 6 | 1 | 1 | 0 | 8 | 1 | 0 | 0 | 0 | 0 | 1 | - | - | - | 1 | 1 | 1 | - | 0 | 3 |
| 7 | 1 | 1 | 1 | 1 | 1 | 0 | 0 | 0 | 1 | 0 | - | - | - | 1 | 0 | 1 | - | 1 | 1 |

Fig. 18

| ADS | a2 | a1 | a0 | RCEL | RD0 | RD1 | RD2 | RD3 | RD4 | SR01 | SR02 | SR03 | SR04 | SR05 | SR06 | SR07 | SR08 | SR09 | PAT |
|---|---|---|---|---|---|---|---|---|---|---|---|---|---|---|---|---|---|---|---|
| 0 | 0 | 0 | 0 | 7 | - | - | - | 1R | 1 | 1 | 0 | 0 | 1 | 0 | 0 | 0 | 1 | 1 | 2 |
| 1 | 0 | 0 | 1 | 6 | - | - | 1 | 1R | - | 1 | 0 | 0 | 1 | 0 | 0 | 1 | 1 | 0 | 1 |
| 2 | 0 | 1 | 0 | 4 | - | 1 | 1R | - | - | 0 | 1 | 1 | 0 | 0 | 1 | 1 | 0 | 0 | 2 |
| 3 | 0 | 1 | 1 | 5 | - | - | - | 1R | 1 | 1 | 0 | 0 | 1 | 0 | 0 | 1 | 1 | 1 | 2 |
| 4 | 1 | 0 | 0 | 3 | - | - | 1R | 1 | - | 0 | 1 | 1 | 0 | 0 | 0 | 1 | 1 | 0 | 2 |
| 5 | 1 | 0 | 1 | 2 | - | 1 | 1R | - | - | 0 | 1 | 1 | 0 | 0 | 1 | 1 | 0 | 0 | 1 |
| 6 | 1 | 1 | 0 | 8 | - | - | 1 | 1R | - | 1 | 0 | 0 | 1 | 0 | 0 | 1 | 1 | 0 | 3 |
| 7 | 1 | 1 | 1 | 1 | - | - | 1R | 1 | - | 0 | 1 | 1 | 0 | 0 | 0 | 1 | 1 | 0 | 1 |

Fig. 20

| ADRS | a2 | a1 | a0 | RCEL | RVG1 | RVG2 | RVG3 | SR10 | SR11 | SR12 | SR13 | SR14 | SR15 | SR16 | PAT |
|---|---|---|---|---|---|---|---|---|---|---|---|---|---|---|---|
| 0 | 0 | 0 | 0 | 7 | – | 0 | 1 | 0 | 1 | 1 | 1 | 0 | 1 | 0 | 2 |
| 1 | 0 | 0 | 1 | 6 | 1 | 0 | – | 1 | 1 | 0 | 1 | 0 | 1 | 0 | 1 |
| 2 | 0 | 1 | 0 | 4 | 1 | 0 | – | 1 | 1 | 0 | 1 | 0 | 1 | 0 | 2 |
| 3 | 0 | 1 | 1 | 5 | – | 0 | 1 | 0 | 1 | 1 | 1 | 0 | 1 | 0 | 2 |
| 4 | 1 | 0 | 0 | 3 | – | 0 | 1 | 0 | 1 | 1 | 1 | 0 | 1 | 0 | 1 |
| 5 | 1 | 0 | 1 | 2 | 1 | 0 | – | 1 | 1 | 0 | 1 | 0 | 1 | 0 | 2 |
| 6 | 1 | 1 | 0 | 8 | – | 1 | 0 | 0 | 1 | 1 | 0 | 1 | 0 | 1 | 3 |
| 7 | 1 | 1 | 1 | 1 | – | 0 | 1 | 0 | 1 | 1 | 1 | 0 | 1 | 0 | 1 |

FIRST PATTERN

SECOND PATTERN

THIRD PATTERN

MEMORY WITH HIGH SPEED READING OPERATION USING A SWITCHABLE REFERENCE MATRIX ENSURING CHARGING SPEED

BACKGROUND OF THE INVENTION

1. Field of the Invention

The present invention relates to a semiconductor memory device.

2. Description of the Related Art

Semiconductor memory devices such as ROM (Read Only Memory) and EPSOM(Erasable and Programmable Read Only Memory) can store data in a memory cell transistor in a binary or multi-value form. In these semiconductor memory devices, a plurality of memory cell transistors are arranged in a matrix. That is, the plurality of memory cells are connected with word lines in a row direction and is connected with digit lines in a column direction. When a storage data is to be read out from a memory cell, bias voltages are applied to the word line and the digit line which are determined in accordance with an address signal. In this way, a quantity of current flowing through the memory cell is sensed and the storage data is read out.

In a conventional semiconductor memory device, each of memory cell transistors is segmented by an element separation area. The source of the memory cell transistor is grounded, the gate thereof is connected with a word line and the drain thereof is connected with a digit line. In such a structure, the structure of the reading circuit can be simplified. However, because a contact with the drain of the memory cell transistor must be formed for every memory cell, the structure is unsuitable for the reduction of a chip area.

To solve such a problem, the arrangement of memory cells of a virtual ground system is proposed. In the semiconductor memory device of this system in which the plurality of memory cell transistors are arranged in a matrix, the source of drain of a memory cell transistor are connected with digit lines in common. Moreover, the source or drain of the memory cell transistor is connected with the source or drain of a neighbor memory cell transistor. For these reasons, the number of drain contacts or source contacts can be reduced and the chip area can be greatly reduced.

When a storage data is read out from a memory cell in the virtual ground system, bias voltages are applied to a selected word line and a selected digit line which are determined in accordance with an address signal, as in the case mentioned above. A quantity of current flowing through the memory cell at this time is sensed by a sense amplifier and the storage data is read. However, the selected digit line to which the memory cell is connected is also connected with a neighbor memory cell which is connected with the same selected word line as the memory cell. Therefore, the bias voltage which has been supplied to a selected digit line diffusion wiring line is supplied to not only the memory cell as the reading operation object but also the neighbor memory cell. Therefore, a read current also flows through the neighbor memory cell through a non-selected digit line diffusion wiring line. As the result, the semiconductor memory device outputs a wrong data. In this way, it is necessary that the non-selected digit line diffusion wiring line is precharged to a level equal to the selected digit line diffusion wiring line. In this case, the read current flows only through the selected memory cell which is connected with the selected digit line diffusion wiring line.

FIG. 1 shows a block diagram of a conventional example of a semiconductor memory device. Referring to FIG. 1, the structure and operation of the semiconductor memory device will be described.

The conventional example of the semiconductor memory device such as a ROM and an EPSOM is composed of an address buffer 51, a Y decoder 52, a Y selector 53, a bank decoder 54, an X decoder 55, a virtual ground (GND) selector 56, a memory cell array in a memory cell matrix 59, a precharging circuit 60, a reference memory cell section 61, a sensing circuit 62, a latch circuit 63, an output buffer 64, a control signal buffer circuit 65, an address transition detecting circuit 66, and a discharge control circuit 67. The memory cell matrix 59 is composed of a memory cell array 58 and a bank selector 57.

The address buffer 51 once holds an address signal AD supplied from an external unit such as a microprocessor, and outputs to the X decoder 55, the Y decoder 52, the bank decoder 54, the virtual ground selector 56, and the address transition detecting circuit 66. The X decoder 55 decodes the address signal AD and selects one of word line selection signals W00 to W63 to set a row of memory cells in the memory cell array 58 to a read and write enable state. The Y decoder 52 decodes the address signal AD and supplies a Y decoding signal to the Y selector 53. The Y selector 53 selects one of digit lines D0 to D4 in response to the Y decoding signal, to set one column of memory cells in the memory cell array 58 to a read enable state. Also, the Y selector 53 supplies predetermined bias voltages to ones of the digit lines D0 to D4 which are selected by the sensing circuit 62 and the precharging circuit 60.

The bank decoder 54 decodes the address signal AD and supplies one of bank selection signals BS1 to BS6 to the bank selector 57. The bank selector 57 connects or disconnects a predetermined digit line diffusion wiring line (not shown) in memory cell array 58 to or from the sensing circuit 62, the precharging circuit 60 and the virtual ground selector 56 in accordance with the bank selection signal BS1 to BS6. It should be noted that the bank selector 57 is collectively shown on the memory cell matrix 59 in FIG. 1. However, the bank selector 57 is divided into a first bank selector and a second bank selector, as mentioned later. The first bank selector selects the connection of the memory cell array 58 to the sensing circuit 62 and the precharging circuit 60, and the second bank selector selects the connection of the memory cell array 58 to the sensing circuit 62 and the virtual ground selector 56. The virtual ground selector 56 selects one of virtual ground lines VG1 to VG3 connected with the memory cell matrix 59 in accordance with the address signal AD from the address buffer 51 to supplies a ground potential GND or a power supply potential Vcc.

The memory cell matrix 59 is composed of the memory cell array 58 and the bank selector 57. The memory cell array 58 is composed of the plurality of memory cells which are arranged in a matrix, and a storage data is read out from the selected memory cell in accordance with the address signal AD. The precharging circuit 60 supplies the bias voltage to a non-selected memory cell in accordance with the position of the selected memory cell in the memory cell matrix 59. As a result, it can be prevented that the current flowing through the selected memory cell flows through the non-selected memory cell. Thus, the storage data can be surely read out. A precharge signal PC is supplied from the precharging circuit 60 to the selected digit line through a switching operation by the Y selector 53 in accordance with the address signal AD.

The reference memory cell section 61 generates a reference digit line signal DGR which is used to distinguish a read digit line signal when the storage data is read out from the selected memory cell of the memory cell matrix 59. The sensing circuit 62 compares the reference digit line signal DGR which is outputted from the reference memory cell section 61 and a digit line signal DG which is outputted from the memory cell matrix 59. Thus, the sensing circuit 62 senses the storage data which has been stored in the selected memory cell of the memory cell matrix 59 and outputs a sense output signal SO to the latch circuit 63. The control signal buffer circuit 65 generates various control signals used in the semiconductor memory device in accordance with a chip select signal CE, a read instruction signal RD, and an output enable signal OE which are supplied from the external unit such as the microprocessor. In FIG. 1, only the chip select signal CE is shown.

The address transition detecting circuit 66 detects that the address signal AD is changed, when the chip select signal CE is in a low level. At this time, the address transition detecting circuit 66 outputs address transition signals AT1 and AT2 in predetermined timings. When the chip select signal CE is in a high level, the address transition detecting circuit 66 does not output the address transition signals AT1 and AT2, even if detecting that the address signal AD is changed. It should be noted that the address transition detecting circuit 66 may generate timing signals in accordance with the transition of a clock signal instead of the address transition, when the clock signal is supplied externally.

The latch circuit 63 latches the sense output signal SO read out from the selected memory cell and detected by the sensing circuit 62, at the time of the rising edge of the address transition signal AT1 to output to the output buffer 64. The output buffer 64 outputs the sense output signal latched by the latch circuit 63 as a data output signal DOUT to the external unit such as the microprocessor. The discharge control circuit 67 discharges charge accumulated in various portions connected with the selected memory cell such as the digit line and the virtual ground (GND) line during the period of the high level of the address transition signal AT2.

Next, the detailed structure of the sensing circuit 62 will be described with reference to FIG. 2. The sensing circuit 62 is composed of a differential amplifier circuit 68, a read detecting section 69 and a reference detecting section 70. The differential amplifier circuit 68 has two input terminals, and compares output voltages from the read detecting section 69 and reference detecting section 70 to determine the storage data of the selected memory cell.

The read detecting section 69 supplies a digit line 78 with a read bias voltage. Also, the read detecting section 69 converts a read current flowing through a digit line 78 and the selected memory cell, into a read voltage to output to the differential amplifier circuit 68. The reference detecting section 70 supplies a bias voltage to a reference digit line 79. Also, the reference detecting section 70 converts a reference current flowing through the reference digit line 79 and a reference memory cell, into a reference voltage to output to the differential amplifier circuit 68.

The discharge control circuit 67 is connected with the digit lines DG and the reference digit lines DGR. Thus, the digit lines DG and the reference digit lines DGR are initialized, before the reading operation from the selected memory cell is started. The discharge control circuit 67 is composed of two N-channel MOS transistors 77. The drains of the respective transistors 77 are connected with the digit line DG 78 and the reference digit line DGR 79, respectively, and the sources thereof are both grounded. Also, the address transition signal AT2 is supplied to the gates of the transistors 77. When the address transition signal AT2 is in the high level, the transistors 77 are turned on and set the potentials of digit line DG 78 and the reference digit line DGR 79 to 0 V. When the address transition signal AT2 is in the low level, the transistors 77 are turned off to be set to the floating state.

The read detecting section 69 is composed of a P-channel MOS transistor 71, an N-channel MOS transistor 72, and two N-channel MOS transistors 73 and 74, a P-channel MOS transistor 75 and a P-channel MOS transistor 76. The P-channel MOS transistor 71 has the gate and the drain which are connected with the differential amplifier circuit 68. The N-channel MOS transistor 72 has the drain which is connected with the drain of the P-channel MOS transistor 71 and the source which is connected with the digit line DG 78. The two N-channel MOS transistors 73 and 74 have the drains which are connected with the gate of the N-channel MOS transistor 72 and the source which is connected with the ground potential GND. The P-channel MOS transistor 75 has the drain which is connected with the gate of the N-channel MOS transistor 72 and the gate which is connected with the gate of the N-channel MOS transistor 73. The P-channel MOS transistor 76 has the drain which is connected with the source of the P-channel MOS transistor 75 and the gate which is connected with the gate of the N-channel MOS transistor 74. A sense enable signal SE is supplied to the gate of the transistor 74 and 76. The transistors 72, 73 and 75 generate the predetermined read bias voltage and the transistor 72 supplies the read bias voltage from the source to the digit line DG 78. The transistor 71 functions as a load circuit of a constant current circuit, converts the read current flowing through the digit line DG 78 into a read voltage and outputs the read voltage to the differential amplifier circuit 68.

When the sense enable signal SE is in a high level, the transistor 76 is turned off and also the transistor 74 is turned on. As the result, the power supply voltage Vdd is not supplied to the drain of the transistor 75 so that the drain of the transistor 74 becomes a low level. Therefore, the transistor 72 is turned off and the supply of the read bias voltage to digit line 78 is stopped.

Oppositely, when the sense enable signal SE is in a low level, the transistor 76 is turned on and the transistor 74 is turned off. As the result, the power supply voltage Vdd is supplied to the source of the transistor 75, the transistors 72, 73 and 75 generate the read bias voltage and the supply of the read bias voltage from the source of the transistor 72 to the digit line 78 is started.

The structure of the reference detecting section 70 is the same as that of the read detecting section 69. However, the size of the load transistor 71 is different. That is, the current drive ability of the load transistor 71 is set in such a manner that the reference voltage outputted from the reference detecting section 70 is a middle voltage between the read voltage GDI(ON) and DGI(OFF), one of which is outputted to the amplifier circuit 68 in accordance with the storage data. Also, the reference detecting section 70 is different from the read detecting section 69 in the point that the source of the N-channel MOS transistor 72 is connected with not the digit line DG 78 but the reference digit line DGR 79.

Next, the detailed structure of the precharging circuit 60 is shown in FIG. 3. Referring to FIG. 3, the structure of the precharging circuit 60 is the same as the read detecting section 69 in the sensing circuit 62 shown in FIG. 2. Therefore, the description is omitted.

Next, the operation of the conventional example of the semiconductor memory device shown in FIG. 1 will be described with reference to the timing chart shown in FIGS. 4A to 4M. Referring to FIGS. 4A to 4M, it is supposed that the address signal AD is supplied from an external unit as shown in FIG. 4B, when the chip select signal CE is in the low level as shown in FIG. 4A. In this case, the address buffer 51 holds the address signal AD to supply to the internal circuits of the semiconductor memory device. Also, the address transition detecting circuit 66 generates an address transfer signal ATD (not shown) and outputs the address transition signals AT1 and AT2 as shown in FIGS. 4D and 4E). The discharge control circuit 67 stops the discharging operation of charge which has been accumulated by the digit line DG and virtual ground line VG, when the address transition signal AT2 goes to the low level as shown in FIG. 4E.

When the sense enable signal SE goes to the low level as shown in FIG. 4C, the read detecting section 69, the precharging circuit 60 and the reference detecting section 70 supply the predetermined bias voltages to the digit lines DG 78 and the reference digit line 79 respectively. The X decoder 55 decodes the address signal AD supplied from the address buffer 51, to set a selected one of the word line selection signals W00 to W63 to the high level and to set the remainder to the low level as shown in FIG. 4F. The Y decoder 52 decodes the address signal AD supplied from the address buffer 51 and outputs a digit line selection signal YSW to the Y selector 53 as shown in FIG. 4H. The Y selector 53 connects the selected digit line which is connected with the selected memory cell, with the sensing circuit 62 in response to the digit line selection signal YSW. As a result, the reading operation of the storage data from the selected memory cell becomes possible.

Also, the digit lines which are connected with the non-selected memory cells are connected with the precharging circuit 60 to make the supply of the precharge signal PC possible as shown in FIG. 4I. As a result, it can be prevented that the read bias current flows through the non-selected memory cells.

The bank decoder 54 decodes the address signal AD supplied from the address buffer 51 and outputs the bank selection signals BS1 to BS6 to the bank selector 57, as shown in FIG. 4G. The bank selector 57 connects the digit lines DG to which the read bias voltage and the precharge signal PC are supplied, with predetermined diffusion layer wiring lines in accordance with the bank selection signals BS1 to BS6. The virtual ground selector 56 decodes the address signal AD supplied from the address buffer 51 and outputs virtual ground selection signals VG1 to VG3 to the memory cell matrix 59 as shown in FIG. 4J. Here, in FIGS. 4A to 4M, the example that the virtual ground selection signal VG1 to VG3 changes to the high level is shown. Besides, the line in the low level and the line in a floating state are present.

When the word line selection signals W00 to W63, and the digit line selection signal YSW, the virtual ground selection signals VG1 to VG3 are supplied to the memory cell matrix 59, one of the memory cells is selected and the read bias voltage is supplied from the sensing circuit 62. As the result, the read current flows through the selected digit line in accordance with to the threshold of the selected memory cell as shown in FIG. 4K. The sensing circuit 62 outputs the sense output signal SO as shown in FIG. 4L, when the read data signal on the digit line DG has the sufficiently large difference, compared with the reference signal on the digit line reference DGR.

When a predetermined time elapsed after the address transfer signal ATD rises up, the address transition detecting circuit 66 sets the address transition signal AT1 to the high level as shown in FIG. 4C. The latch circuit 63 latches the sense output signal SO at the timing that the address transition signal AT1 rises up, and the output buffer 64 outputs the data output signal DOUT as shown in FIG. 4M.

When the sense enable signal SE goes to the high level as shown in FIG. 4C, the read detecting section 69, the reference detecting section 70, the precharging circuit 60 stop the supply of the predetermined bias voltage to the digit lines 78 and the reference digit line 79, respectively. The discharge control circuit 67 starts the discharging operation from the digit line DG as shown in FIG. 4K, when the address transition signal AT2 goes to the high level as shown in FIG. 4E.

By repeating the above operations, the semiconductor memory device outputs the storage data to the external unit.

There is in the conventional example of the semiconductor memory device, a problem that the read current does not flow sufficiently to the selected memory cell from which the storage data should be read out, so that a wrong storage data is read out. Also, there is another problem that the read current decreases so that the wrong storage data is read out, because many transistors intervene between the digit line terminal and the virtual ground terminal.

To solve these problems, the following technique is disclosed in Japanese Laid Open Patent Application (JP-A-Heisei 4-311900). In this reference, as shown in FIG. 1 of this reference, 2-stage bank selection circuits are arranged in the upper side and lower side of the memory cell array, respectively. Also, two digit line diffusion wiring line are connected with the drains of the respective memory cell transistors of the memory cell array from one digit line terminal, respectively. Also, in the same way, two digit line diffusion wiring lines are connected with the sources of the memory cell transistors of the memory cell array from one virtual GND terminal VG, respectively. In this way, the above-mentioned problems are tried to solve.

Certainly, there is a possibility that the problem of the erroneous reading operation of the storage data and the problem of the decrease of the reading speed can be solved in some degree. However, the problem of the erroneous reading operation of the storage data and the problem of the decrease of the reading speed are still left. Also, the bank selection circuit has a 4-stage structure so that the conventional technique can not be applied to the apparatus with the multi-stage bank selection structure. Moreover, it is necessary to connect one aluminum line to two diffusion layers in the digit line terminal or the virtual GND terminal. Therefore, the gate density of the circuit is limited by the arrangement pitch of the aluminum lines. Recently, the miniaturization of the transistor element advances and the memory cell can be made small. However, the chip area becomes large as the gate density is increased, and the wiring line connected with the memory cell become long. Therefore, because it is necessary to decrease a wiring line resistance to read the storage data at high speed, the wiring line width must be secured to some extent.

To solve the above problem, the following technique is disclosed in Japanese Laid Open Patent Application (JP-A-Heisei 11-96780). That is, first sub-digit lines are provided twice or ½ times of the number of second sub-digit lines. By this, the sufficient read current can be flowed to the selected memory cell so that the storage data can be correctly read out. Also, because only the small number of transistors intervene between the digit line terminal and the virtual ground terminal, the read current is not decreased, compared with the conventional technique. Therefore, the correct data can be read out.

Here, the structure and operation of the conventional semiconductor memory device in Japanese Laid Open Patent Application (JP-A-Heisei 11-96780) will be described with reference to FIGS. 5 to 7. FIG. 5 is an equivalent circuit diagram showing the connection relation of parts in a memory cell array. FIG. 6A is a cross sectional view showing the structure of memory cell transistors T1 to T4, and FIGS. 6B to 6D are expanded equivalent circuit diagrams of the connection relation of parts in the memory cell array shown in FIG. 5.

As shown in FIG. 5 and FIGS. 6A to 6D, in the conventional virtual ground type semiconductor memory device, the plurality of memory cell transistors T1 to T4 are connected in series. The gate of each memory cell transistor is connected with one word line. FIG. 6A shows one of the plurality of word line. The source and drain of each of the memory cell transistor T1 to T4 are formed by $N^+$ diffusion layers 93 N1 to N5. Also, the $N^+$ diffusion layer 93 functions as the source or drain of the memory cell transistor and extends in to the column direction. The $N^+$ diffusion layer 93 extending in the column direction is referred to as the digit line diffusion wiring line. The digit line diffusion wiring lines 88 N1, 90 N3 and 92 N5 are connected with the selected digit line 80 and function as the drains of the memory cell transistors. Also, the digit line diffusion wiring lines 89 N2 and 91 N4 are connected with the virtual ground line 85 and function as the sources of the memory cell transistors. That is, the drain $N^+$ diffusion layer and the source $N^+$ diffusion layer are alternately arranged in parallel. The digit line diffusion wiring lines 88, 90, 92, 89, and 91 are connected with the selected digit line 80 and the virtual ground line 85 through the bank selection transistor BT (not shown), respectively. The selected digit line 80 functions as a precharging line 81 through the switching operation of the Y selector 53. The gate of a reference memory cell transistor 86 is connected with the word line, the drain of the reference memory cell transistor 86 is connected with the reference digit line 82 and the source thereof is connected with a ground line 87.

Next, the principle in a reading operation of the storage data from the memory cell will be described in accordance with FIG. 5 and FIGS. 6A to 6D. It is now supposed that the selected memory cell 83 T2 is selected and the storage data is read out. At this time, the word line goes to the high level, and a read bias voltage of 1 V is supplied to the drain N3 of the selected memory cell transistor 83 T2 through the selected digit line 80 and the digit line diffusion wiring line 90. The source of the selected memory cell transistor T2 is grounded to 0 V through the digit line diffusion wiring line 89 and the virtual ground line 85. Therefore, as shown in FIG. 6B, the read current flows through the selected digit line 80 in accordance with the storage data (the threshold value) of the selected memory cell 83 T2.

In the same way, a bias voltage of 1 V is supplied to the drain of the reference memory cell transistor 86 through the reference digit line 82 and the reference digit line diffusion wiring line. Also, the source the reference memory cell transistor 86 is grounded to 0 V through the diffusion wiring line and the ground line 87. Therefore, the reference current flows through the reference digit line 82 in accordance with the threshold value of the reference memory cell transistor 86. The sensing circuit 62 compares the read current and the reference current to determine the storage data. In this way, the storage data can be read out.

Next, as mentioned above, the storage data of the selected memory cell 83 T2 is read out. In this case, it is supposed that the threshold value of the memory cell transistor 83 T2 is high and the read current is small (hereinafter, to be referred to as an OFF cell). Also, it is supposed that the threshold value of a neighbor non-selected memory cell transistors T3 and T4 is low and the read current is large (hereinafter, to be referred to as ON cells). When the read bias voltage is supplied to the selected digit line 80, the read bias voltage is applied to not only the drain of the selected memory cell transistor 83 T2 but also the drain of the neighbor non-selected memory cell transistor 84 T3. This state is shown in FIG. 6C. The gates of the non-selected memory cell transistors 84 T1, T3 or T4 are connected with the same word line as the selected memory cell transistor 83 is connected. Therefore, the read current flows through the non-selected memory cell transistors 84 T3 and T4, if the digit line diffusion wiring line 92 is 0 V. The sensing circuit 62 regards that the read current has flowed through the selected memory cell transistor 83 T2. As the result of this, the storage data is erroneously sensed.

In order to prevent the erroneous sensing operation, as shown in FIG. 5 and FIG. 6D, the same voltage (also, to be referred to as a precharge voltage) as the read bias voltage is applied to the digit line 81 (to be referred to as a precharging line) directly neighbor to the selected digit line 80 connected to the selected memory cell transistor 83 T2. In the example shown in FIG. 6D, the digit line diffusion wiring line 92 as the drain N5 of the transistor T4 is precharged to 1 V. Also, the potentials of the sources of the transistor T3 and T4 and the potentials of the drains thereof are set to be equal to each other. As a result, the read current does not flow through the transistor T3 and T4. In this way, even in case of FIG. 6C, the read current does not flow through the digit line diffusion wiring line 92 and it is correctly recognized that the transistor T2 is in the OFF state.

FIG. 7 shows a circuit section of the memory cell matrix of the semiconductor memory device in detail. The memory cell matrix is composed of the memory cell array 58, and the first bank selector 113, and the second bank selector 114. In this conventional example, the first and second bank selectors 113 and 114 are connected with two and four digit line diffusion wiring lines, respectively. However, the number of digit line diffusion wiring lines 105 connected with the first and second bank selectors 113 and 114 may be appropriately selected. The memory cell array 58 is composed of a plurality of memory cells 95 which are arranged in a matrix. The gate of the memory cell transistor is connected with one of the word lines 96. The word line selection signal W00 to W63 are supplied to the word lines. Also, the drain and source of the memory cell transistor 95 are connected with the digit line diffusion wiring lines 105, and are connected with the first and second bank selectors 113 and 114, respectively. That is, as to the digit line diffusion wiring lines 105, the digit line diffusion wiring line 105 connected with the first bank selector 113 and the digit line diffusion wiring line 105 connected with the second bank selector 114 are alternately arranged. Each of the memory cells is arranged between these digit line diffusion wiring lines 105. Therefore, in the memory cell transistor, the source thereof is possibly connected with the ground potential and the drain thereof is possibly connected to the sensing circuit 62.

The first bank selector 113 has two bank selection transistors BT1 and BT2 for one digit line. The drains of the bank selection transistors BT1 and BT2 are possibly connected with the digit line 80 or precharging line 81 through one of a plurality of digit line terminals 97 to 101 and the Y selector 53. Also, the gates of the bank selection transistors BT1 and BT2 are connected with the bank selection lines 106 and 107, respectively. Also, the bank selection signals BS1 and BS2 are supplied to the bank selection lines 106 and 107. Also, the sources of the bank selection transistors BT1 and BT2 are connected with the digit line diffusion wiring lines 105 in the memory cell array 58.

A precharge signal PC is supplied to the digit line diffusion wiring line 105 which is selected in accordance with the bank selection signal BS1 and BS2 by the first bank selector 113, when the read bias voltage is supplied to one of the digit line terminals 97 to 101. The second bank selector 114 has four bank selection transistors 112 BT3 to BT6 for one virtual ground line. The source of each of the bank selection transistors 112 BT3 to BT6 is connected with a corresponding one of a plurality of virtual ground terminals 102 to 104, and is connected with the ground potential through the virtual ground selector 56. Also, the gate of each of the bank selection transistors 112 BT3 to BT6 is connected with a corresponding one of the bank selection lines 108 to 111. The bank selection signals BS3 to BS6 are supplied to the bank selection lines 108 to 111, respectively. The drain of each of the bank selection transistors 112 BT3 to BT6 is connected with the digit line diffusion wiring line 105 on the source side of the memory cell transistor. The digit line diffusion wiring line 105 is selected in accordance with the bank selection signals BS3 to BS6 by the second bank selector 114. The selected digit line diffusion wiring line 105 is connected with the source of the selected memory cell 83 (FIG. 5 and FIGS. 6A to 6D) to allow the read current to flow through the selected memory cell 83.

Next, the memory cell matrix 59 shown in FIG. 7 will be described with reference to a truth table shown in FIG. 8. Referring to FIG. 8, columns a2, a1, a0 show lower 3 bits of the accessed address signal AD, and a column AD is the hexadecimal representation. Also, a column CEL shows a number n of the selected memory cells SXn (n=1 to 8 in FIG. 7). Columns D0 to D4, columns VG1 to VG3, columns BS6 to BS1 show the signal levels of the digit line terminals, the signal levels of the virtual ground terminals, and the signal levels of the bank selection lines, respectively.

The case will be described in which lower 3 bits [a2, a1, a0] of the accessed address signal AD are [1, 1, 1], and the storage data is read out from the memory cell SX1 (FIG. 7). The memory cell SX1 is connected with the word line selection signal W63 in the hexadecimal representation on the word lines 96. At this time, the word line selection signal W63 is in the high level and the other word line selection signals W00 to W62 are in the low level. The bank selection signals BS6 and BS2 are in the high level in accordance with the address signal AD, and the other bank selection signals are in the low level. Therefore, the transistor BT2 in the first bank selector 113 is turned on and the transistor BT1 is turned off. Also, the transistor BT6 in the second bank selector 114 is turned on and the bank selection transistors BT3 to BT5 are turned off. The digit lines connected with the digit line terminals D2 and D3 are in the high level and the digit lines connected with the digit line terminals D0, D2 and D4 are in the floating state. Also, the virtual ground selection signal VG2 which is supplied to the virtual GND terminals 102 to 104 is in the low level, the virtual ground terminal VG3 is in the high level and the virtual ground terminal VG1 is in the floating state.

The read bias voltage is supplied from the sensing circuit 62 to the drain of the selected memory cell SX1 through the Y selector 53, the digit line terminal 99 D2, the transistor BT2 and the digit line diffusion wiring line 105. On the other hand, the virtual ground terminal 103 VG2 in the low level is connected to the source of the transistor SX1 through the transistor BT6 and the digit line diffusion wiring line 105. Therefore, the drain of the memory cell transistor SX1 is about 1 V, the source thereof becomes 0 V. As a result, the read current flows from the digit line terminal 99 D2 to the virtual ground terminal 103 VG2 in accordance with the storage data of the memory cell SX1.

Here, it is supposed that the threshold of the memory cells SX2 to SX8 are low (ON cells) so that the read current flows. In this case, the read bias voltage supplied to the selected memory cell charges the digit line diffusion wiring lines 105 connected with the memory cells SX2 to SX8. Therefore, the read current flows through the memory cells SX2 to SX8 even if the threshold of the memory cell SX1 is high (OFF cell) so that the read current does not flow. As a result, the sensing circuit 62 erroneously senses the storage data of the memory cell SX1.

To prevent this problem, the same voltage as the read bias voltage is applied to the virtual ground terminal 104 VG3 and the digit line terminal 100 D3 to prevent pseudo-read current from flowing. This voltage is referred to as a precharge voltage. The precharge voltage PC is supplied from the digit line terminal 100 D3 to the non-selected memory cells SX5 to SX2 through the transistor BT2 and the digit line diffusion wiring line 115. In the same way, the precharge voltage PC is supplied from the virtual ground terminal 104 VG3 to the non-selected memory cells SX8 to SX2 through the transistor BT6 and the digit line diffusion wiring line 105. At this time, the potentials of the drain of the non-selected memory cell transistors SX8 to SX2 become equal to the source potentials thereof. Therefore, the pseudo-read current never flows.

Next, as shown in FIG. 7, it is supposed that the bank selection signals BS5 and BS2 are in the high level and the other bank selection signals are in the low level in accordance with the address signal AD. Therefore, the transistor BT2 in the first bank selector 113 is turned on, the transistor BT1 is turned off, the transistor BT5 in the second bank selector 114 is turned on and the transistors BT3, BT4 and BT6 are turned off. Also, the signals on the digit lines connected with the digit line terminals D1 and D2 are in the high level and the signals on the digit lines connected with the digit line terminals D0, D3 and D4 are in the floating state. Also, the virtual ground terminal 103 VG2 is in the low level, the virtual ground terminal 102 VG1 is in the high level and the virtual ground terminal VG3 is in the floating state. Therefore, the read current flows in order of the digit line terminal 99 D2→ the transistor BT2→ the digit line diffusion wiring line 105→ the selected memory cell SX2→ the digit line diffusion wiring line 105→ the transistor BT5→ the virtual ground terminal 103 VG2.

When the memory cell SX2 is selected, the precharge voltage is applied to the virtual ground terminal 102 VG1 and the digit line terminal 98 D1 to prevent the pseudo-read current from flowing on the side of the non-selected memory cell SX1. In this way, the portion supplied with the precharge voltage is dependent on the location of the selected memory cell in the memory cell array 58. In other words, the precharge voltage is applied to the digit line terminal neighbor to the selected digit line terminal on the side of the source of the selected memory cell. Also, the precharge voltage is applied to the virtual ground terminal neighbor to the selected virtual ground terminal on the side of the source of the selected memory cell. The reading operation is carried out in accordance to the truth table shown in FIG. 8 as for the other memory cells SX3 to SX8.

Hereinafter, the device structure of the memory cell matrix 59 and the peripheral portion will be described with reference to FIG. 9 to FIG. 11. FIG. 9 shows a plan view of a portion of the memory cell matrix 59. FIG. 10 shows a cross sectional view along the line A—A of FIG. 9, and FIG. 11 shows a cross sectional view along the line B—B of FIG. 9.

Referring to FIG. 9, the memory cell matrix 59 is composed of the memory cell array 58, and the first and second bank selectors 113 and 114. Generally, the memory cell matrix 59 is composed of a plurality of memory cell arrays, and the plurality of bank selectors. Also, the virtual ground lines 85 (VG1, VG2, and so on) and the digit lines 78 (D0, D1, D2, and so on) are arranged to connect these memory cell arrays and the bank selectors. Also, the digit lines 78 and the virtual ground lines 85 are formed of metal such as aluminum and copper or silicide such as WSi to reduce the wiring line resistance.

The digit lines 78 (D0, D1, D2, and so on) are respectively connected with the digit line terminals (97, 98, 99, and so on) which are composed of $N^+$ diffusion layers through the plugs (120, 122 and so on). The virtual ground lines 85 (VG1, VG2, and so on) are respectively connected with the virtual ground terminals (102, 103, and so on) which are composed of $N^+$ diffusion layers through the plug (123, 124 and so on). The $N^+$ diffusion layers connected with the digit line terminals (97, 98, 99, and so on) function as the drains of the bank selection transistors BT1 and BT2. The $N^+$ diffusion layers connected with the virtual ground terminals (102, 103, and so on) function as the sources of the bank selection transistors BT3 to BT6.

Also, the digit line diffusion wiring lines 105 which are composed of $N^+$ diffusion layers are formed in parallel to the above mentioned $N^+$ diffusion layers. The $N^+$ diffusion layers function as the sources of the bank selection transistors BT1 and BT2 and function as the drains of the bank selection transistors BT3 to BT6. Also, in the memory cell array 58, the $N^+$ diffusion layers connected with the bank selection transistors BT1 and BT2 function as the drains of the memory cell transistors. The $N^+$ diffusion layers connected with the bank selection transistors BT3 to BT6 function as the sources of the memory cells. The bank selection transistors 112 (BT1 to BT6) are formed between the digit line diffusion wiring line 105 and one of the digit line terminals or one of the virtual ground terminals under the bank selection lines. The memory cell transistor is formed between the $N^+$ diffusion layers of the two digit line diffusion wiring lines 105 under the word lines 96. Also, in FIG. 9, the rectangular region shown by slanted lines is a channel stopper region where $P^+$ impurities are injected.

Referring to FIG. 10, the $N^+$ diffusion layers 93 are embedded in a predetermined interval. The $N^+$ diffusion layer 93 functions as the source or drain of the memory cell transistor and bank selection transistor and as the digit line diffusion wiring lines. An ion implanted channel 126 of the ON cell or an ion non-implanted channel 127 of the OFF cell is formed in the channel region between the $N^+$ diffusion layers 93 in accordance with the storage data. A gate insulating film 94 is formed on the P-channel substrate 125 and the $N^+$ diffusion layer 93, and the word lines 96 are formed on the gate insulating film 94. A lower interlayer insulating film 128 is formed on the word lines 96 and a metal wiring lines D0, VG1, D1, D2, VG2 are arranged in a predetermined interval on the interlayer insulating film 128. Moreover, an upper interlayer film 128 is formed on the metal wiring lines 129 and the interlayer film 128.

Referring to FIG. 11, the $N^+$ diffusion layers 93 are embedded in consideration of the arrangement of the word lines 96. A plug is arranged on one of the $N^+$ diffusion layers 93. The gate insulating films 94 are arranged in a predetermined interval on the $N^+$ diffusion layers and the P-channel substrate 125. The word lines 96 are arranged on the gate insulating films 94. Moreover, the lower interlayer insulating films 128 exist on the $N^+$ diffusion layers 93, the P-channel substrate 125 and the word lines 96. Metal wiring lines 129 are arranged on the lower interlayer insulating film 128 and the plugs, and the upper interlayer insulating film 128 is again arranged on the metal wiring lines 129. In this way, the digit line 78 D0 is connected with the digit line terminal 97 as the $N^+$ diffusion layer 93 through the plug 120, and functions as the drain of the bank selection transistor 112. Also, the $N^+$ diffusion layer 93 direct below the word lines 96 functions as the source of the memory cell transistor.

In this way, because the virtual ground type memory cell array 58 can be formed without providing a plug for every memory cell, a lot of memory cells can be formed in the minimum area. Also, because the digit lines function as main digit lines and the digit line diffusion wiring lines function as sub-digit lines, a parasitic capacity and a leak current of the memory cell can be reduced when being seen from the sensing circuit.

Referring to FIG. 9 again, in the semiconductor memory device of this conventional example, the plurality of digit lines 78 and the plurality of virtual ground lines 85 extend in parallel over a long distance. Also, the digit lines 78 and the virtual ground lines 85 are different from each other in the number, and the kind of the wiring line which is present in neighbor to each wiring line depends on the position of the memory cell. Moreover, as shown in FIG. 8, because the levels of the signals supplied to each digit line 78 and each virtual ground line 85 are different, dependent on the address signal AD, the influence situation of coupling noise depends on the state of the neighbor signal.

As shown in FIGS. 12A to 12D and FIGS. 13A to 13D, the phenomenon that the charging operation speed of the digit line depends on the state of the neighbor digit line will be described.

FIGS. 12A to 12D show a rising characteristic of the digit line 78 when the voltage value of a digit line or virtual ground line neighbor to the selected digit line 78 (hereinafter, to be referred to as a neighbor line) does not change. FIGS. 13A to 13D show a rising characteristic of the digit line 78 when the voltage value of the neighbor line to the selected digit line 78 changes. FIG. 12A and FIG. 13A show the time changes of the read bias voltage V1 supplied to the selected digit line 80 from the sensing circuit 62. FIG. 12B and FIG. 13B show the time changes of the precharge signals V2 supplied to the neighbor line from the precharging circuit 60. FIG. 12C and FIG. 13C show the time changes of the coupling noise voltages VN which the precharge signal V2 supplied to the neighbor line gives to the selected digit lines 78. FIG. 12D and FIG. 13D show the time changes of output voltages V0 to the sensing circuit 62.

When the read bias voltage V1 is applied to the selected digit line 78 as shown in FIG. 12A, the read current flows through the selected digit line 78 and the selected memory cell. By this, as shown in FIG. 12D, the output voltage V0 is outputted to the sensing circuit 62. This output voltage V0 is gradually increased after a delay time lapses. In the example shown in FIGS. 13A to 13D, the read bias voltage V1 is applied to the selected digit line 78, and the output voltage V0 is outputted to the sensing circuit 62, as in the example shown in FIGS. 12A to 12D. However, as shown in FIG. 13C, the selected digit line 78 receives the influence of the coupling noise voltage VN from the neighbor line in accompaniment with the increase of the precharge voltage V2. Therefore, the output voltage V0 in which the coupling noise voltage VN is superimposed on the output voltage V0 shown in FIG. 12D is outputted to the sensing circuit 62.

In this way, when the precharge signal is supplied to the neighbor line at the same time as the read bias voltage, the output voltage outputted to the sensing circuit becomes as if the rising time or the delay time becomes short, compared with the example shown in FIG. 12D.

FIGS. 14A and 14B show the time changes of the output voltages DG1 and DG2 on the digit lines 78 and the reference voltage DGR on the reference digit line 79. The output voltage DG1 or DG2 and the reference voltage DGR are supplied to the sensing circuit 62. Here, the output voltages DG1(ON) and DG2(ON) show the voltages generated from the ON cells, and the output voltages DG1(OFF) and DG2(OFF) show the voltages generated from the OFF cell. Also, FIG. 14A shows a case that the influences of the coupling noise to the digit line 78 is small, and FIG. 14B shows a case that the influences of the coupling noise to the digit line 78 is large.

As shown in FIG. 14A, the influences of the coupling noise to the digit lines 78 and the reference digit line 79 are small. Therefore, the output voltages DG1(ON) and DG1(OFF) and the reference voltage DGR have substantially the same rising characteristic. In FIG. 14A, a period is long from time when that reading operation is made possible to time when the difference between the output voltage DG1(ON) or DG1(OFF) and the reference voltage DGR becomes large so that the sensing circuit 60 can sense the storage data from the selected memory cell.

On the other hand, as shown in FIG. 14B, when the digit line 78 undergoes the influence of the coupling noise from the neighbor line, the rising operation of the output voltage DG2(ON) or DG2(OFF) becomes faster than the rising operation of the reference voltage DGR. However, because the output voltage is sensed at the same time t2 as in the case shown in FIG. 14A, the sensing circuit 62 erroneously senses both of the ON cell and the OFF cell to be the OFF cell. Also, to correctly sense the output voltages DG2(ON) and DG2(OFF), it is necessary to wait until the time t3. Therefore, the read time becomes long so that the efficiency of the semiconductor memory device is degraded.

In this way, in Japanese Laid Open Patent Application (JP-A-Heisei 4-311900), because a digit line and a virtual ground line are alternately arranged, the coupling noise is the same, so that the above mentioned problem can be avoid, even if which of memory cells is selected. However, the above mentioned problem is caused, when the arrangement of the memory cell matrix shown in Japanese Laid Open Patent Application (JP-A-Heisei 11-96780) is adopted to improve an integration density.

In recent years, the operation speed of a microprocessor is increased remarkably, and still more improvement is demanded about the operation speed of a semiconductor memory device connected with the microprocessor. As described above, the charging operation speed of the selected digit line is different for every address. On the other hand, the charging operation speed of the reference digit line is constant. Therefore, if the charging operation speed of the reference digit line is designed in accordance with the digit line with a slow charging operation speed, it is difficult to accomplish the high speed reading operation of the storage data from the memory cell. Oppositely, if the charging operation speed of the reference digit line is designed in accordance with the digit line with the fastest charging operation speed and the sensing operation is carried out in a short time, the sensing circuit erroneously senses the output voltage on the digit line.

SUMMARY OF THE INVENTION

Therefore, an object of the present invention is to provide semiconductor memory device in which the integration density can be increased and a plurality of digit lines are provided between virtual ground lines.

Another object of the present invention is to provide a semiconductor memory device with no address dependency in a reading operation speed of a storage data from a memory cell.

Still another object of the present invention is to provide a semiconductor memory device in which a reading operation can be carried out in accordance with a digit line with the fastest reading speed without depending on the structure of the digit lines.

Yet still another purpose of the present invention is to provide a semiconductor memory device which a high speed reading operation of a memory cell storage data is possible regardless of the structure of a memory cell matrix.

In order to achieve an aspect of the present invention, a semiconductor memory device includes a memory cell matrix section, a reference memory cell matrix section and a sensing circuit. The memory cell matrix section includes memory cells arranged in a first matrix. When one of the memory cells is selected based on an address signal, a read data signal corresponding to a storage data of the selected memory cell is outputted. The reference memory cell matrix section includes reference memory cells arranged in a second matrix, and outputs a reference data signal for the read data signal from the selected memory cell. The sensing circuit senses the storage data based on the read data signal from the memory cell matrix section and the reference data signal from the reference memory cell matrix section. At this time, the reference memory cell matrix section outputs the reference data signal to the sensing circuit such that the reference data signal appears in substantially synchronous with the data read signal.

Here, the reference memory cell matrix section may output the reference data signal to the sensing circuit based on the address signal.

Also, each of the memory cells may be connected to either one of word lines and each of the reference memory cells may be connected to either one of the word lines.

Also, the reference memory cell matrix section may include a reference memory cell matrix, a first selector, a first bank selector, a second selector and a second bank selector. The reference memory cell matrix includes the reference memory cells arranged in the second matrix. A selected one of the reference memory cells is connected to a first digit line, and remaining ones of the reference memory cells are non-selected reference memory cells. The first selector applies a read bias for the selected reference memory cell. Also, the first selector applies a first reference precharge signal for a second reference digit line connected with a first one of the non-selected reference memory cells to provide a correct current path for the reference data signal. The first bank selector transfers the read bias to the first digit line and the first reference precharge signal to the second digit line. The second selector applies a ground voltage and a second reference precharge signal for the reference memory cell matrix. The second bank selector transfers the ground voltage to a third digit line connected with the selected reference memory cell and the second reference precharge signal to a fourth digit line connected with a second one of the non-selected memory cells. At this time, the reference data signal corresponds to a current flowing through the first digit line, the selected reference memory cell and the third digit line, when the read bias is applied to the selected reference memory cell. In this case, the memory cells may be arranged to form the first matrix of basic repetition units. Also, the reference memory cell matrix section may include the reference memory cells which are arranged to have the same structure as a basic repetition unit of the memory cells in the memory cell matrix section.

Also, the reference memory cell matrix section may include a reference memory cell matrix, a first selector, a first bank selector, a second selector and a second bank selector. The reference memory cell matrix includes the reference memory cells arranged in the second matrix. A selected one of the reference memory cells is connected to a first digit line, and remaining ones of the reference memory cells are non-selected reference memory cells. The first selector applies a read bias for the selected reference memory cell. Also, the first selector applies a first reference precharge signal for a second reference digit line connected with a first one of the non-selected reference memory cells based on the address signal to provide a correct current path for the reference data signal. The first bank selector transfers the read bias to the first digit line and the first reference precharge signal to the second digit line based on the address signal. The second selector applies a ground voltage and a second reference precharge signal for the reference memory cell matrix based on the address signal. The second bank selector transfers the ground voltage to a third digit line connected with the selected reference memory cell and the second reference precharge signal to a fourth digit line connected with one of the non-selected memory cells based on the address signal. At this time, the reference data signal corresponds to a current flowing through the first digit line, the selected reference memory cell and the third digit line, when the read bias is applied to the selected reference memory cell. In this case, the memory cells may be arranged to form the first matrix of basic repetition units. Also, the reference memory cell matrix section may include the reference memory cells which are arranged to have the same structure as a basic repetition unit of the memory cells in the memory cell matrix section. Also, the first and second bank selection signals may be generated based on the address signal to select the selected memory cell in the memory cell matrix section.

Also, the reference memory cell matrix section may include a reference memory cell matrix, a third selector, a first bank selector, a second selector and a second bank selector. The reference memory cell matrix includes the reference memory cells arranged in the second matrix. A reference digit wiring line and a reference virtual ground wiring line are alternately provided to extend in a column direction and the reference memory cells of each row are provided between the reference digit wiring line and the reference virtual ground wiring line in a row direction. One of the reference memory cells selected based on the address signal is connected to a first one of the reference digit wiring lines, and remaining ones of the reference memory cells are non-selected reference memory cells. The third selector applies a read bias for the first reference digit wiring line connected to the selected reference memory cell. Also, the third selector applies a first reference precharge signal for a second one of the reference digit wiring lines connected with a first one of the non-selected reference memory cells based on one of bias patterns which is determined based on the address signal. The bias patterns is predetermined based on a first number and a second number. The first bank selector includes first bank selection transistors which are grouped in units of the first numbers. Also, the first bank selector transfers the read bias to the first digit wiring line and the first reference precharge signal to the second digit wiring line based on the address signal using the first bank selection transistors. The second selector applies a ground voltage and a second reference precharge signal for the reference memory cell matrix based on the one bias pattern. The second bank selector includes second bank selection transistors which are grouped in units of the second numbers. Also, the second bank selector transfers the ground voltage to a first one of the virtual ground wiring lines connected with the selected reference memory cell and the second reference precharge signal to a second one of the virtual ground wiring lines connected with one of the non-selected memory cells based on the address signal using the second bank selection transistors. At this time, the reference data signal corresponds to a current flowing through the first digit wiring line, the selected reference memory cell and the first virtual ground wiring line, when the read bias is applied to the selected reference memory cell. In this case, two of the reference memory cells connected one of the reference digit wiring line has a same storage data.

Also, the reference memory cell matrix section may include a plurality of reference digit lines which have different resistance and different parasitic capacities, respectively, a plurality of virtual ground lines connected to a ground potential, a reference memory cell matrix, a fifth selector, a first bank selector, and a second bank selector. The reference memory cell matrix includes the reference memory cells arranged in the second matrix. A reference digit wiring line and a reference virtual ground wiring line are alternately provided to extend in a column direction and the reference memory cells of each row are provided between the reference digit wiring line and the reference virtual ground wiring line in a row direction. One of the reference memory cells selected based on the address signal is connected to a first one of the reference digit wiring lines, and remaining ones of the reference memory cells are non-selected reference memory cells. The fifth selector selects a first one of the plurality of reference digit lines and a second one of the plurality of reference digit line. Also, the fifth selector applies a read bias for the first reference digit line to be connected to the selected reference memory cell. Also, the fifth selector applies a first reference precharge signal for the second reference digit line connected with a first one of the non-selected reference memory cells based on one of bias patterns which is determined based on the address signal, the bias patterns being predetermined based on a first number and a second number. The first bank selector includes first bank selection transistors which are grouped in units of the first numbers. The first bank selector transfers the read bias from the first reference digit line to the first digit wiring line and the first reference precharge signal from the second digit line to a second one of the digit wiring lines based on the address signal using the first bank selection transistors. The second bank selector includes second bank selection transistors which are grouped in units of the second numbers. Also, the second bank selector connects the ground voltage to a first one of the plurality of virtual ground wiring lines connected with the selected reference memory cell and a second reference precharge signal to a second one of the plurality of virtual ground wiring lines connected with one of the non-selected memory cells based on the address signal using the second bank selection transistors. At this time, the reference data signal corresponds to a current flowing through the first reference digit line, the first digit wiring line, the selected reference memory cell and the first virtual ground wiring line, when the read bias is applied to the selected reference memory cell. In this case, two of the reference memory cells connected one of the reference digit wiring line has different storage data.

Also, the reference memory cell matrix section may include a plurality of reference digit lines, a virtual ground line, a reference memory cell matrix, a selective precharging circuit, a first bank selector, and a second bank selector. The reference memory cell matrix includes the reference memory cells arranged in the second matrix. A reference digit wiring line and a reference virtual ground wiring line are alternately provided to extend in a column direction and the reference memory cells of each row are provided between the reference digit wiring line and the reference virtual ground wiring line in a row direction. One of the reference memory cells selected based on the address signal is connected to a first one of the reference digit wiring lines, and remaining ones of the reference memory cells are non-selected reference memory cells. The selective charging circuit applies a read bias for a first of the plurality of reference digit lines which is connected to the selected reference memory cell. Also, the selective charging circuit applies a reference precharge signal for a second one of the plurality of reference digit lines which is connected with a first one of the non-selected reference memory cells. A value of the reference precharge signal is determined based on the address signal. The first bank selector transfers the read bias from the first reference digit line to the first reference digit wiring line and the reference precharge signal from the second reference digit line to the second reference digit wiring line based on a first bank selection signal. The second bank selector connects the ground voltage to the virtual ground wiring line connected with the selected reference memory cell based on a second bank selection signal, the first and second bank selection signals being determined based on the address signal. At this time, the reference data signal corresponds to a current flowing through the first reference digit line, the first reference digit wiring line, the selected reference memory cell and the virtual ground line, when the read bias is applied to the selected reference memory cell. In this case, two of the reference memory cells connected one of the reference digit wiring line may have different storage data. Also, the selective charging circuit may apply the reference precharge signal for the second reference digit line in response to the first and second bank selection signals. Also, the selective charging circuit may include a plurality of transistors supplying a plurality of currents as the reference precharge signal based on the address signal. In this case, the plurality of transistors may have different current supply capabilities, and each of the plurality of transistors are selectively turned on based on the address signal. Also, the plurality of transistors may have different gate widths. Alternatively, the plurality of transistors may have different gate lengths.

Also, each of the memory cell matrix section and the reference memory cell matrix section includes a bank selector section. At this time, the semiconductor memory device may further includes a bank decoder decoding the address signal.

Also, the semiconductor memory device may further include an X decoder decoding the address signal to specify one of word lines which are common to the memory cell matrix section and the reference memory cell matrix section.

Also, a semiconductor memory device includes a memory cell matrix section, a reference memory cell matrix section and a sensing circuit. The memory cell matrix section includes memory cells are arranged in a first matrix. When one of the memory cells is selected based on an address signal, the selected memory cell is connected to a first column wiring line. Also, a precharge signal is applied to at least one second column wiring line connected to one of the memory cells other than the selected memory cell and a read data signal corresponding to a storage data of the selected memory cell is outputted. The reference memory cell matrix section includes reference memory cells arranged in a second matrix. The reference memory cell matrix section outputs a reference data signal for the read data signal from the selected memory cell, the reference data signal corresponding to influence of the precharge signal to the read data signal. The sensing circuit senses the storage data based on the read data signal from the memory cell matrix section and the reference data signal from the reference memory cell matrix section. At this time, the reference memory cell matrix section outputs the reference data signal to the sensing circuit such that the reference data signal appears in substantially synchronous with the data read signal.

Also, a semiconductor memory device includes a memory cell matrix section, a reference memory cell matrix section and a sensing circuit. The memory cell matrix section includes memory cells are arranged in a first matrix. When one of the memory cells is selected based on an address signal, the selected memory cell is connected to a first column wiring line. At this time, a precharge signal is applied to at least one second column wiring line connected to one of the memory cells other than the selected memory cell and a read data signal corresponding to a storage data of the selected memory cell is outputted. The reference memory cell matrix section includes reference memory cells arranged in a second matrix. The reference memory cell matrix section outputs a reference data signal from a selected one of the reference memory cells corresponding to the selected memory cell, wherein the selected reference memory cell is connected a reference digit line whose charging speed is controlled based on influence of the precharge signal to the read data signal. The sensing circuit senses the storage data based on the read data signal from the memory cell matrix section and the reference data signal from the reference memory cell matrix section. At this time, the reference memory cell matrix section outputs the reference data signal to the sensing circuit such that the reference data signal appears in substantially synchronous with the data read signal.

BRIEF DESCRIPTION OF THE DRAWINGS

FIG. 8 is a truth table of a bank selector and a virtual ground selector of the conventional example of the semiconductor memory device;

FIG. 18 is a truth table of the RDP decoder in the semiconductor memory device according to the first embodiment of the present invention;

FIG. 20 is a truth table of the RV decoder in the semiconductor memory device according to the first embodiment of the present invention;

DESCRIPTION OF THE PREFERRED EMBODIMENTS

Hereinafter, the semiconductor memory device of the present invention will be described below in detail with reference to the attached drawings.

[First Embodiment]

Figure 15:
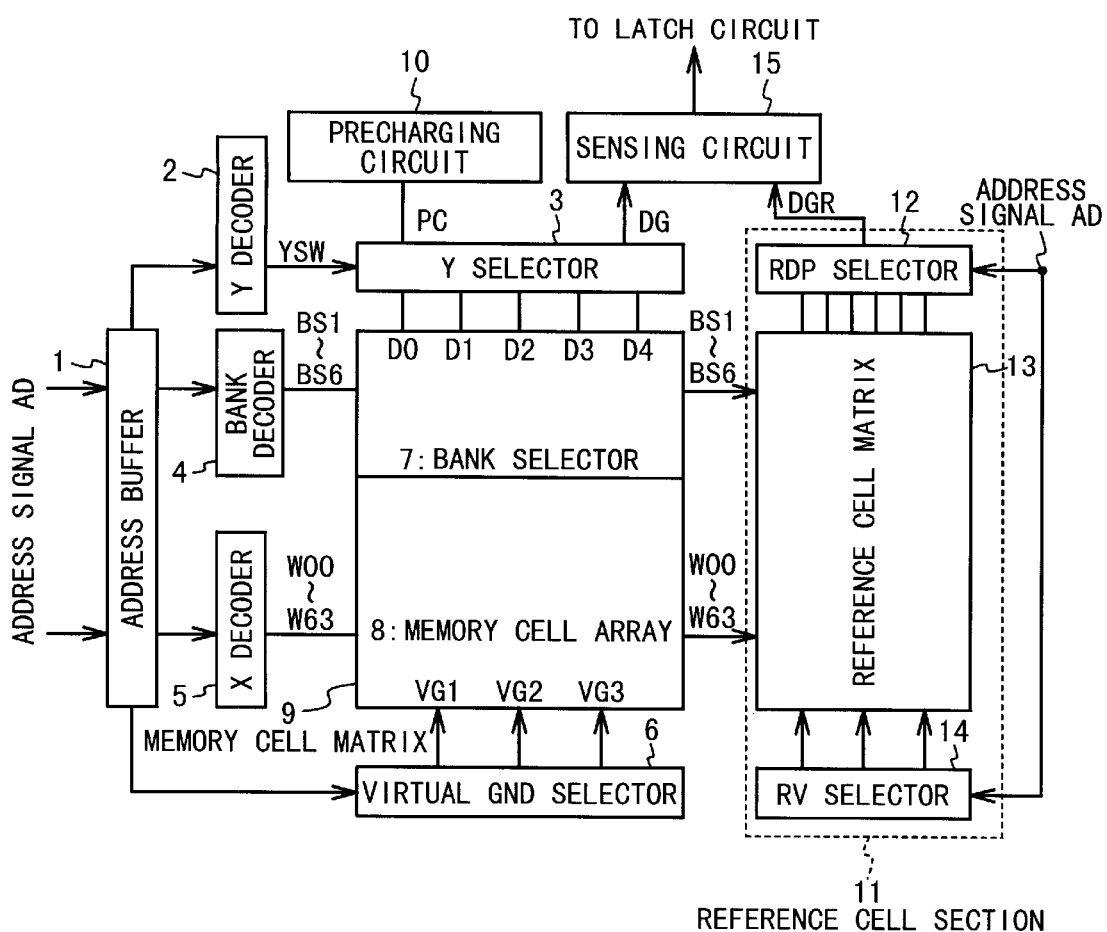
FIG. 15 is a block diagram showing the structure of a semiconductor memory device according to a first embodiment of the present invention.
Figure 16:
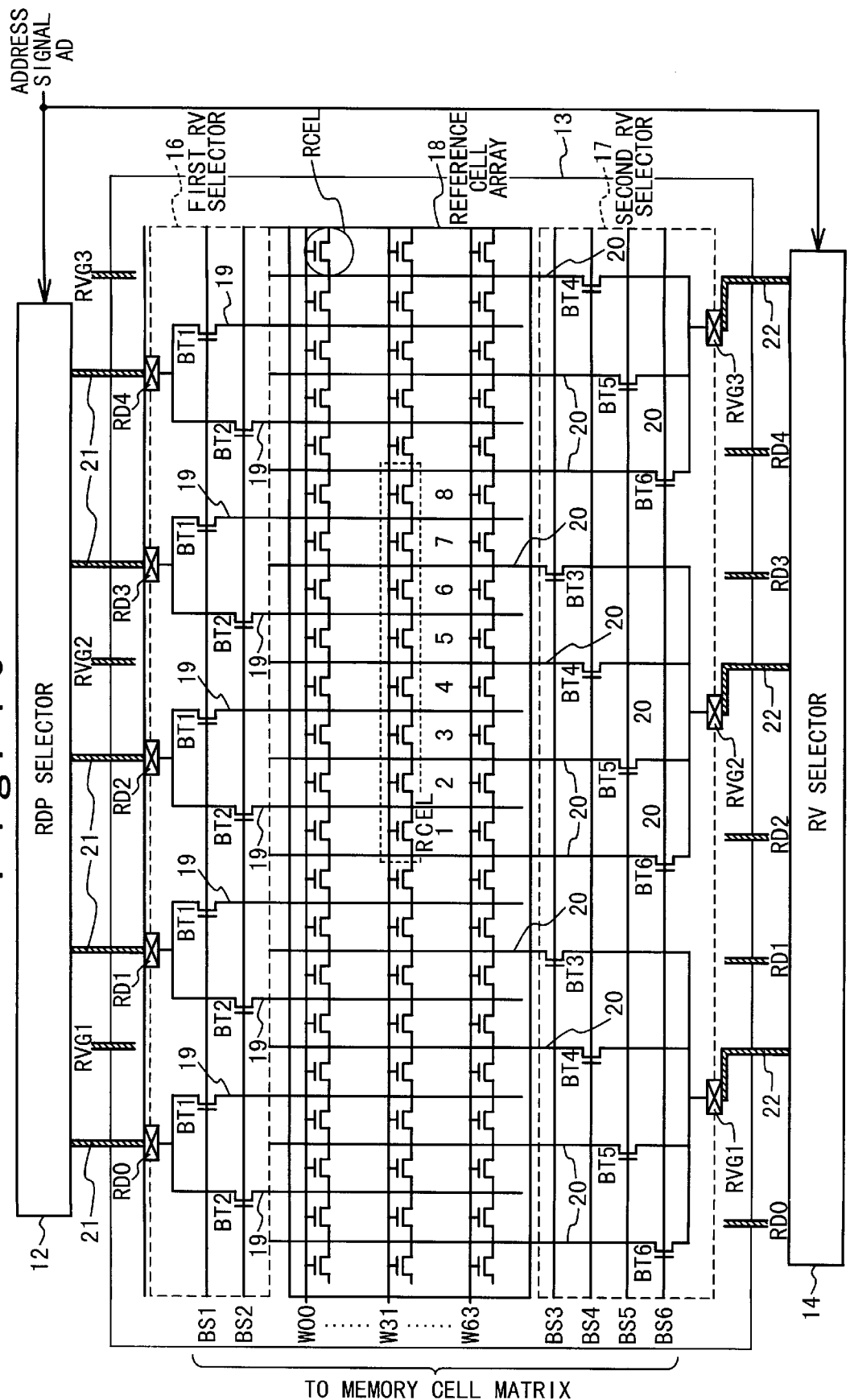
FIG. 16 is a circuit diagram of a reference memory cell section in the semiconductor memory device according to the first embodiment of the present invention.
Figure 19:
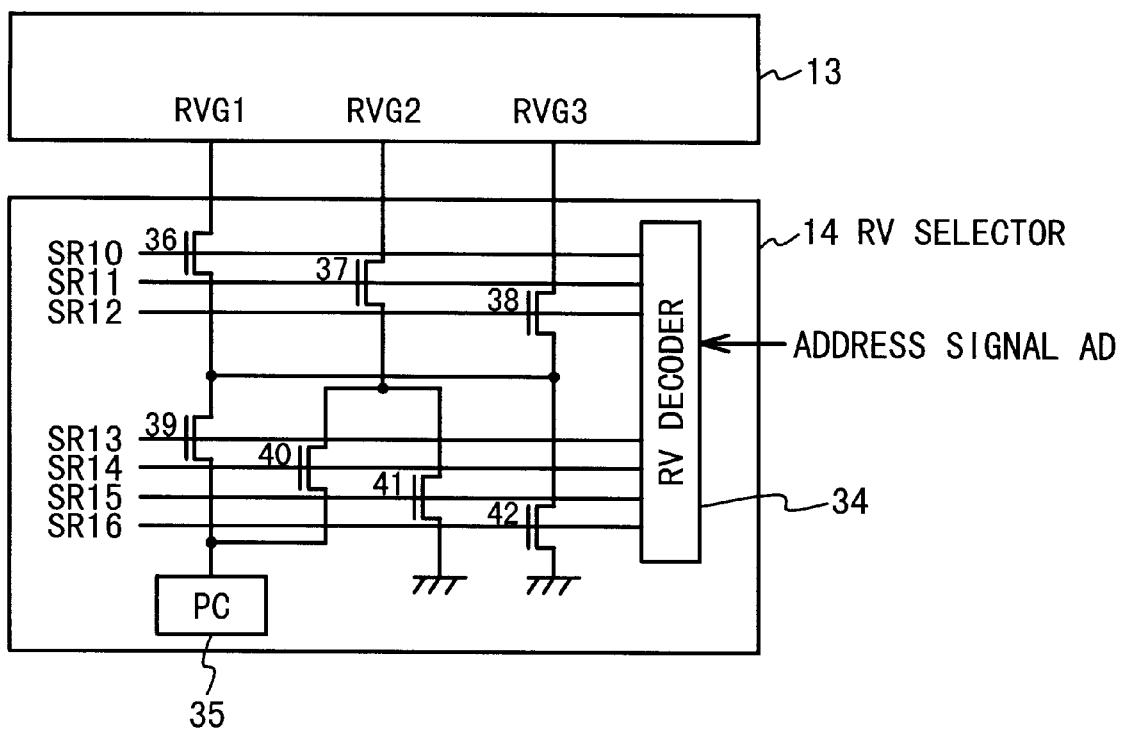
FIG. 19 is a block diagram showing an RV selector in the semiconductor memory device according to the first embodiment of the present invention.
Figure 21A:
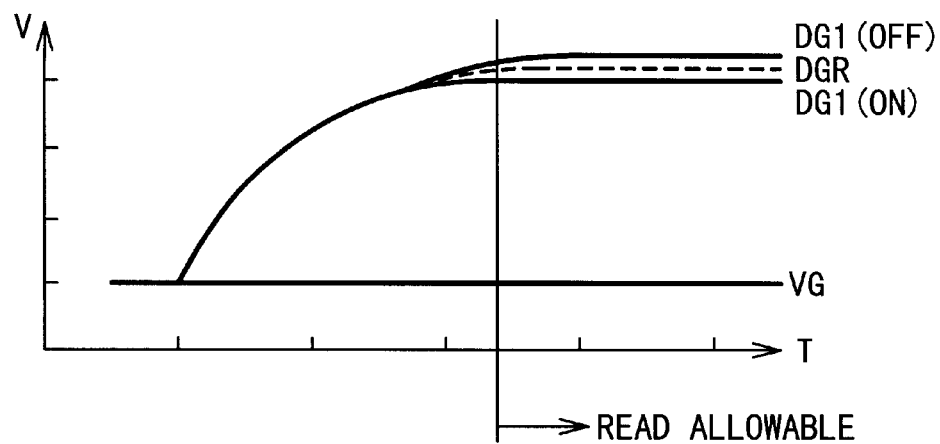
FIGS. 21A and 21B are timing charts showing relations between the voltage values on a digit line and a reference digit line which are inputted to a sensing circuit in the semiconductor memory device according to the first embodiment of the present invention, when the digit line does not receive coupling noise and when the digit line receives the coupling noise.
Figure 21B:
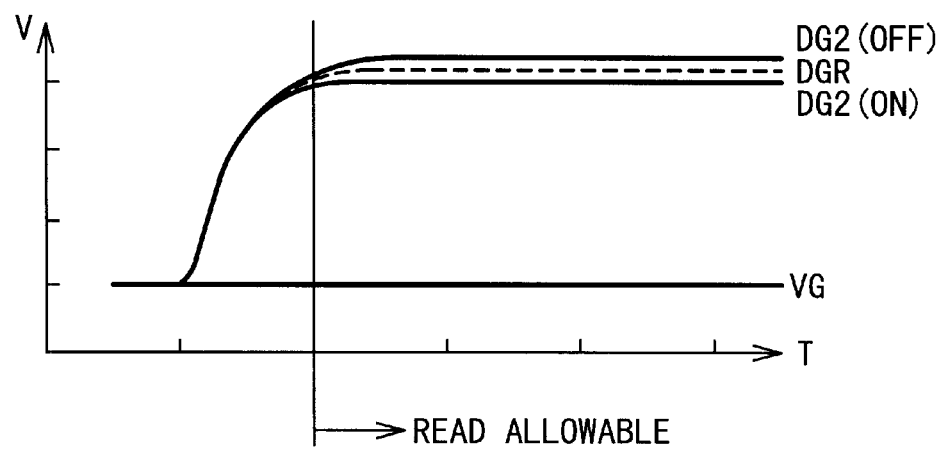

FIG. 15 is a block diagram showing a main portion of the semiconductor memory device according to the first embodiment of the present invention. FIG. 16 is a circuit diagram of a reference memory cell section in the semiconductor memory device according the first embodiment of the present invention. FIG. 13 is a circuit diagram showing an RDP selector in the semiconductor memory device according the first embodiment of the present invention. FIG. 18 is a diagram showing a truth table of the RDP decoder in the semiconductor memory device according the first embodiment of the present invention. FIG. 19 is a circuit diagram of a RV selector in the semiconductor memory device according the first embodiment of the present invention. FIG. 20 is a diagram showing a truth table of the RV decoder in the semiconductor memory device according the first embodiment of the present invention. FIGS. 21A and 21B are waveform diagrams showing a relation between a voltage inputted from a digit line to a sensing circuit and a voltage inputted from the reference digit line to the sensing circuit in the semiconductor memory device according the first embodiment of the present invention. FIG. 21A shows the case where the digit line does not receive any coupling noise, and FIG. 21B shows the case where the digit line receives any coupling noise.

The structure of the semiconductor memory device according to the first embodiment of the present invention will be described with reference to FIG. 15.

Referring to FIG. 15, the semiconductor memory device in this embodiment is composed of an address buffer 1, a Y decoder 2, a Y selector 3, a bank decoder 4, an X decoder 5, a virtual ground selector 6, a memory cell matrix 9 including a bank selector 7 and a memory cell array 8, a precharging circuit 10, a reference memory cell section 11 and a sensing circuit 15. It should be noted that the semiconductor memory device in this embodiment is further composed of a latch circuit 63, an output buffer 64, a control signal buffer circuit 65, an address transition detecting circuit 66 and a discharge control circuit 67 which are shown in the conventional example of FIG. 1. However, because they are the same as in the conventional example, illustration is omitted.

Figure 1:
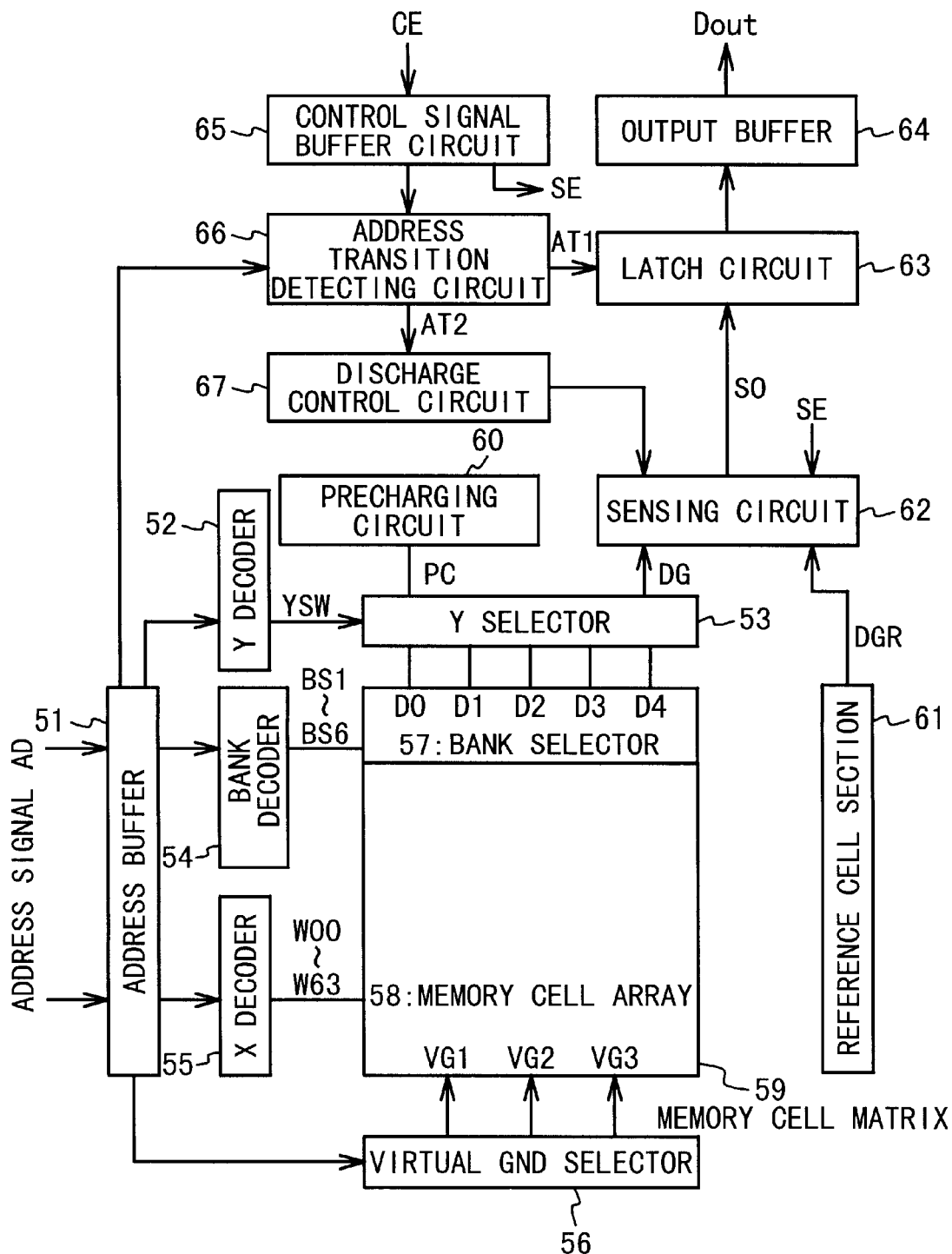
FIG. 1 is a block diagram of a conventional example of a semiconductor memory device.
Figure 2:
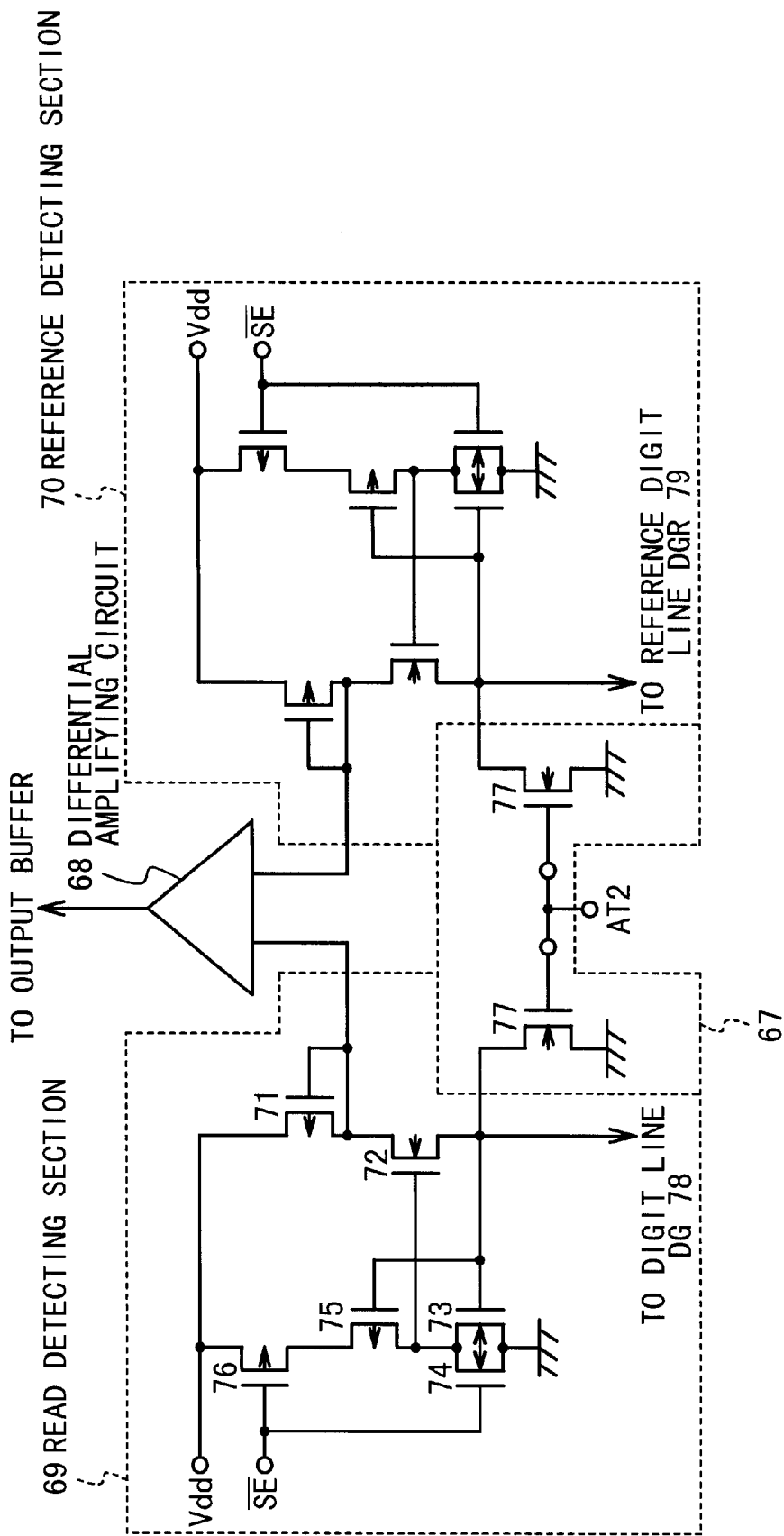
FIG. 2 is a sensing circuit in the conventional example of the semiconductor memory device.
Figure 3:
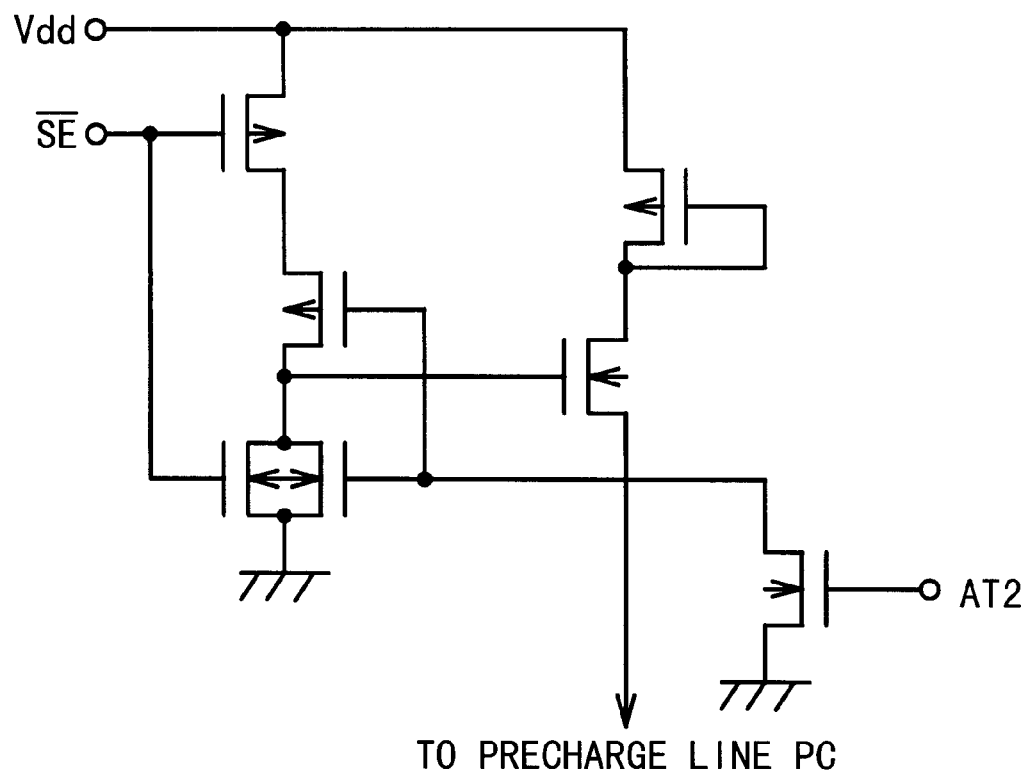
FIG. 3 is a precharging circuit in the conventional example of the semiconductor memory device.
Figure 4:
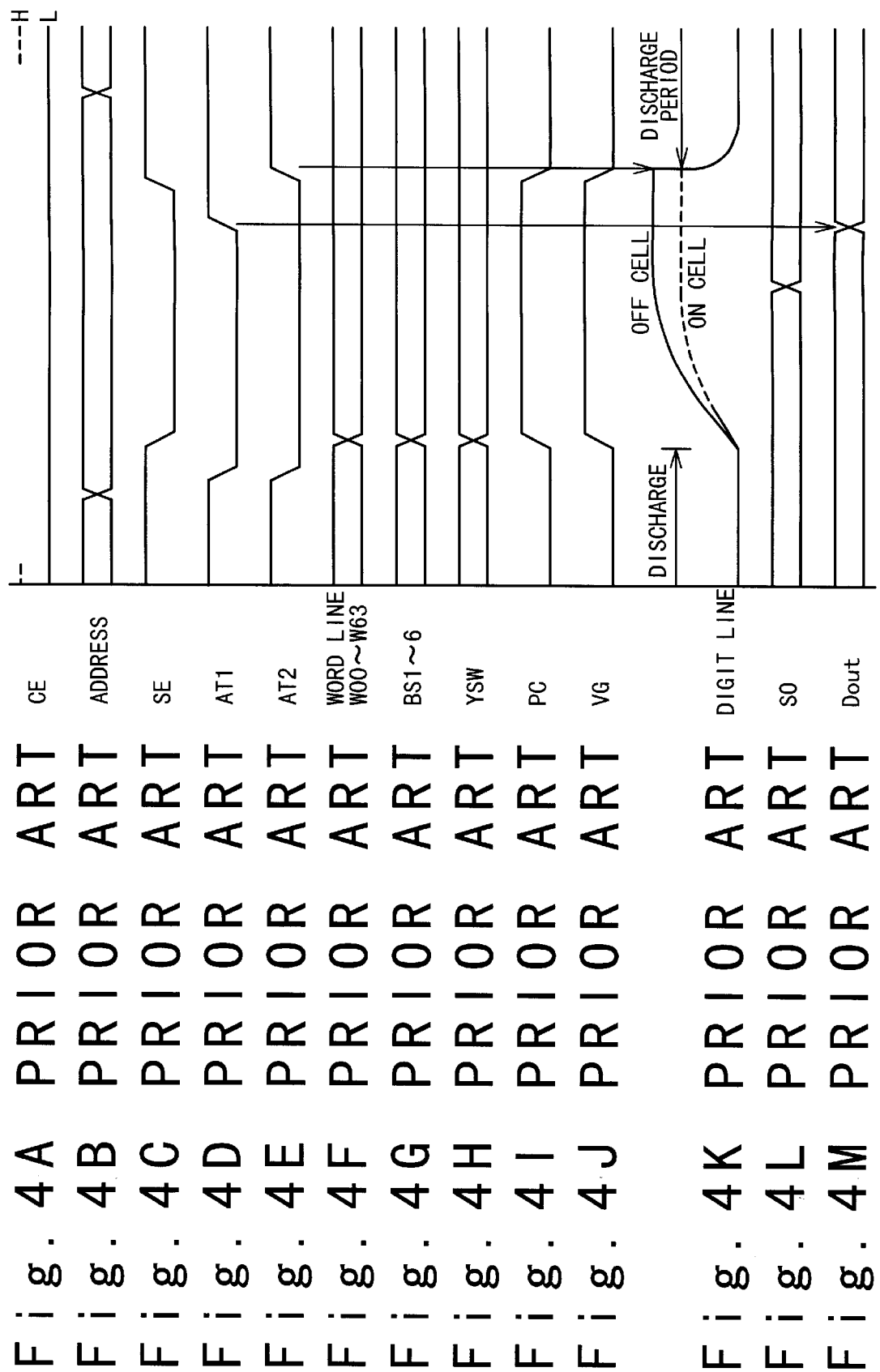
FIGS. 4A to 4M are timing charts showing the operation of the conventional example of the semiconductor memory device.

Also, except for the reference memory cell section 11, the address buffer 1, the Y decoder 2, the Y selector 3, the bank decoder 4, the X decoder 5, the virtual ground selector 6, the memory cell matrix 9 including the bank selector 7 and the memory cell array 8, the precharging circuit 10, and the sensing circuit 15 have the same functions and same structures as the address buffer 51, the Y decoder 52, the Y selector 53, the bank decoder 54, the X decoder 55, the virtual ground selector 56, the memory cell matrix 59 including the bank selector 57 and the memory cell array 58, the precharging circuit 60, and the sensing circuit 62, which are shown in FIG. 1, respectively. Therefore, the description is omitted.

The reference memory cell section 11 in this embodiment is composed of an RDP selector 12, a reference memory cell matrix 13 and an RV selector 14.

Figure 5:
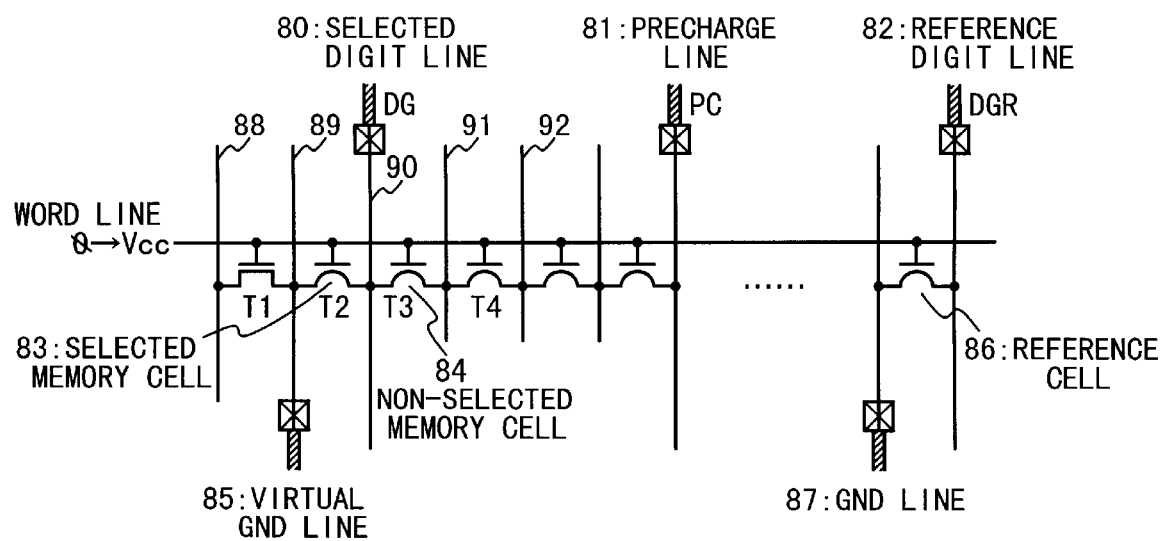
FIG. 5 is a diagram showing an equivalent circuit of a connection relation in a memory cell array in another conventional example of the semiconductor memory device.
Figure 6A:
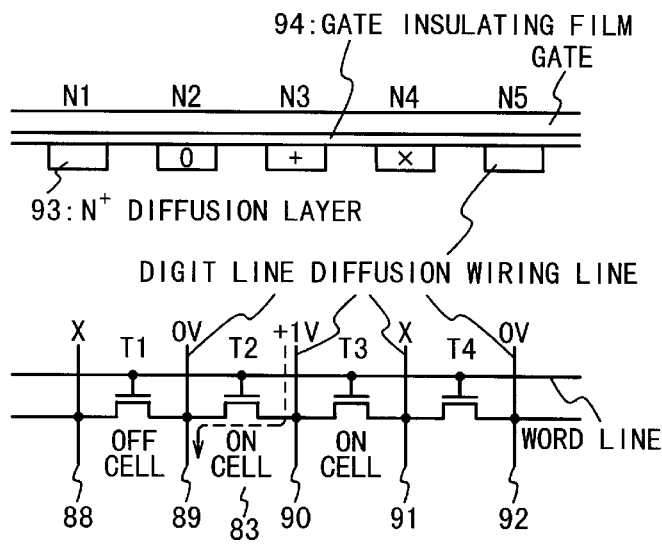
FIG. 6A is a cross sectional view showing the structure of the transistor T1 to T4 of the memory cell array shown in FIG. 5, and FIGS. 6B to 6D are equivalent circuit diagrams showing a method of preventing an erroneous sensing operation in FIG. 5.
Figure 6B:
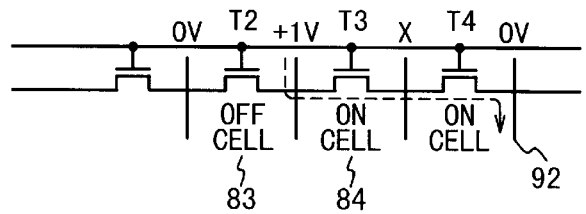
Figure 6C:
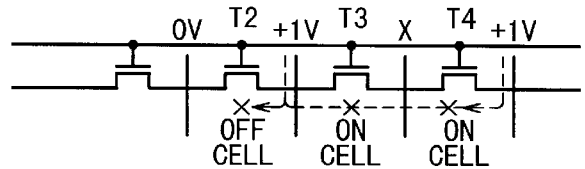
Figure 6D:
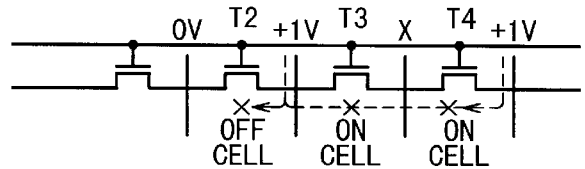
Figure 9:
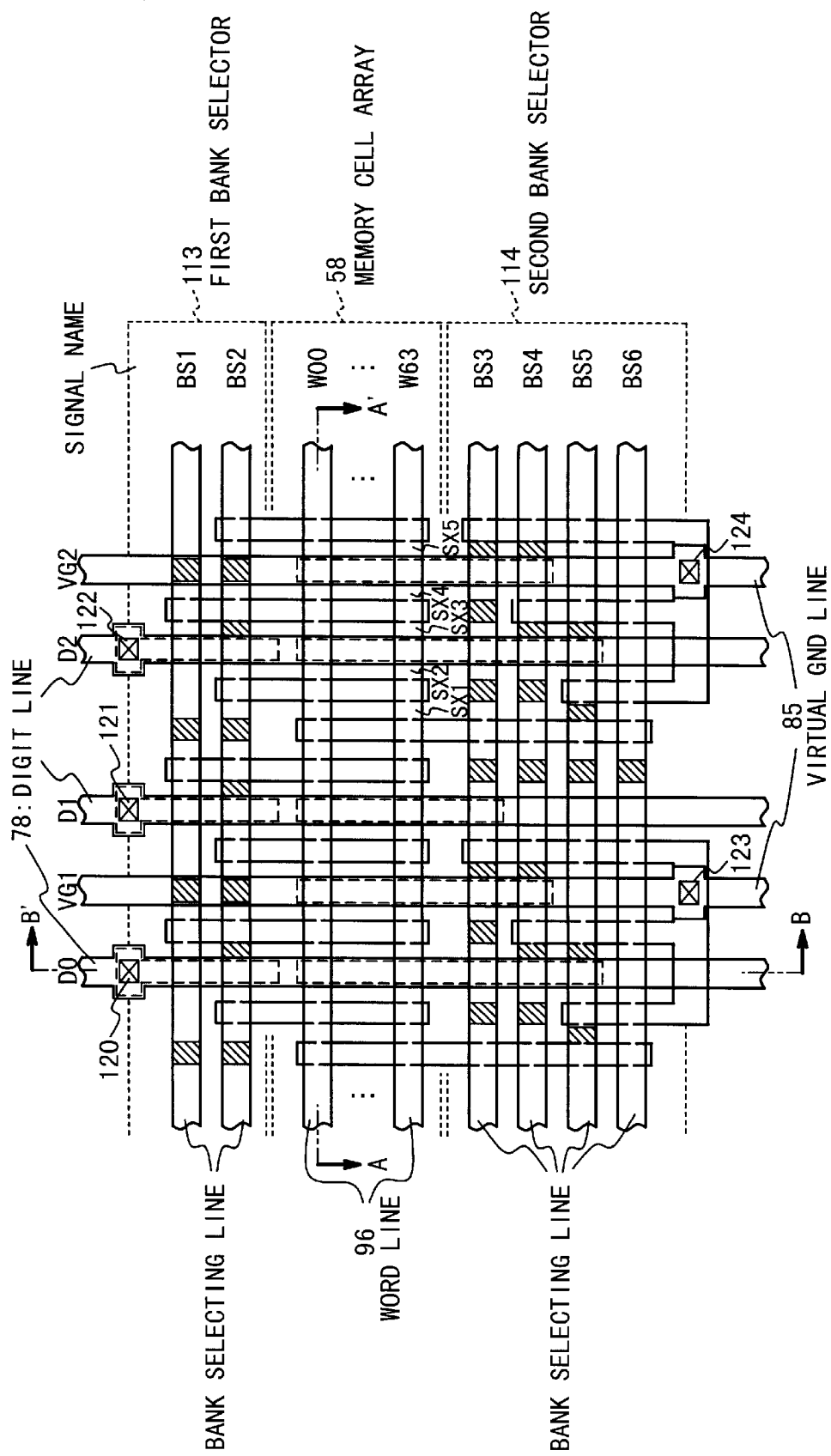
FIG. 9 is a plan view of a part of the memory cell matrix section of the conventional example of the semiconductor memory device.
Figure 10:
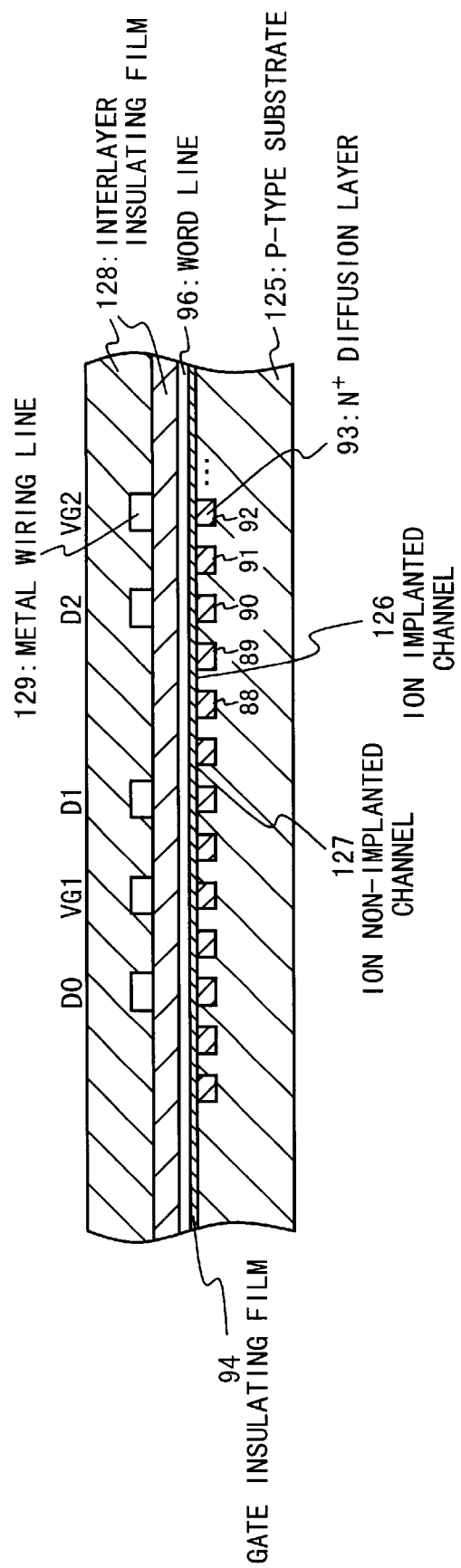
FIG. 10 is a cross sectional view of the conventional example of the semiconductor memory device of FIG. 9 along the line A—A.
Figure 11:
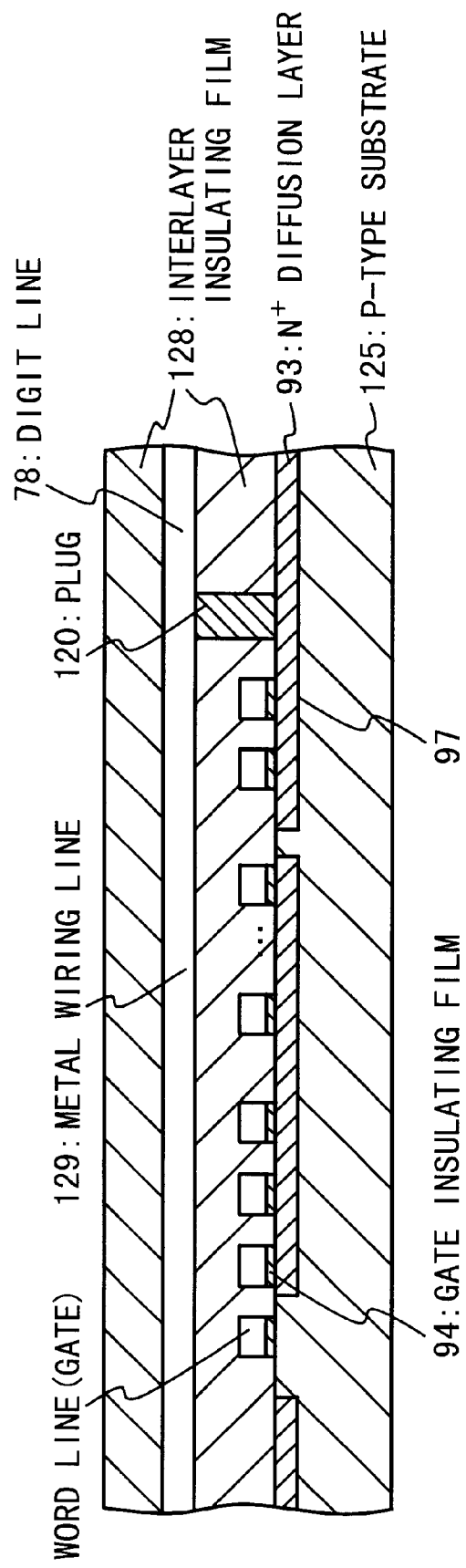
FIG. 11 is a cross sectional view of the conventional example of the semiconductor memory device of FIG. 9 along the line B—B.
Figure 12A:
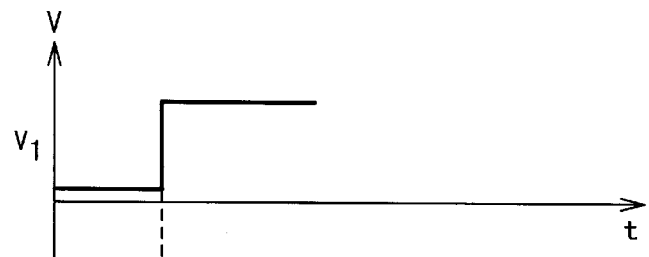
FIGS. 12A to 12D are timing charts showing the charging operation of a digit line in the case where voltage value of a digit line or virtual ground line neighbor to the above digit line does not change in the conventional example of the semiconductor memory device.
Figure 12B:
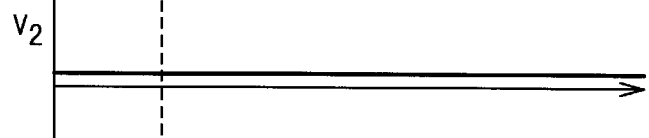
Figure 12C:
Figure 12D:
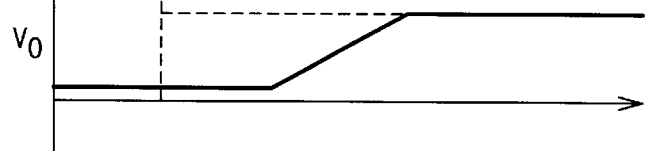
Figure 13A:
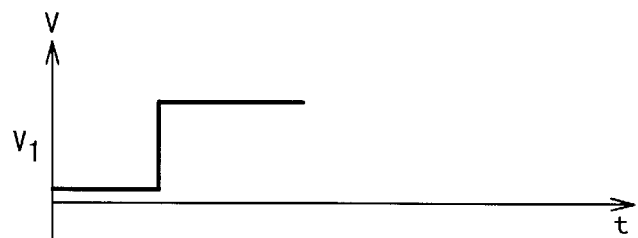
FIGS. 13A to 13D are timing charts showing the charging operation of a digit line in the case where voltage value of a digit line or virtual ground line neighbor to the above digit line changes in the conventional example of the semiconductor memory device.
Figure 13B:
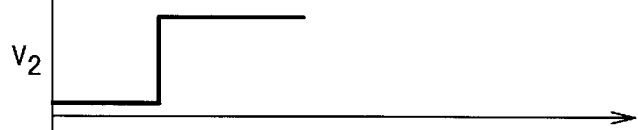
Figure 13C:
Figure 13D:
Figure 14A:
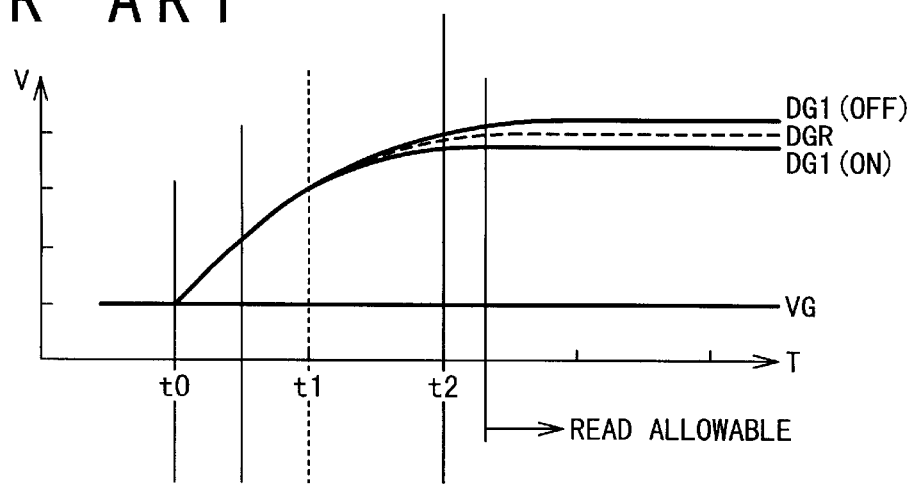
FIGS. 14A and 14B are timing charts showing read voltages DG1(ON) and DG1(OFF) and a reference voltage DGR which are inputted to a sensing circuit in the conventional example of the semiconductor memory device.
Figure 14B:
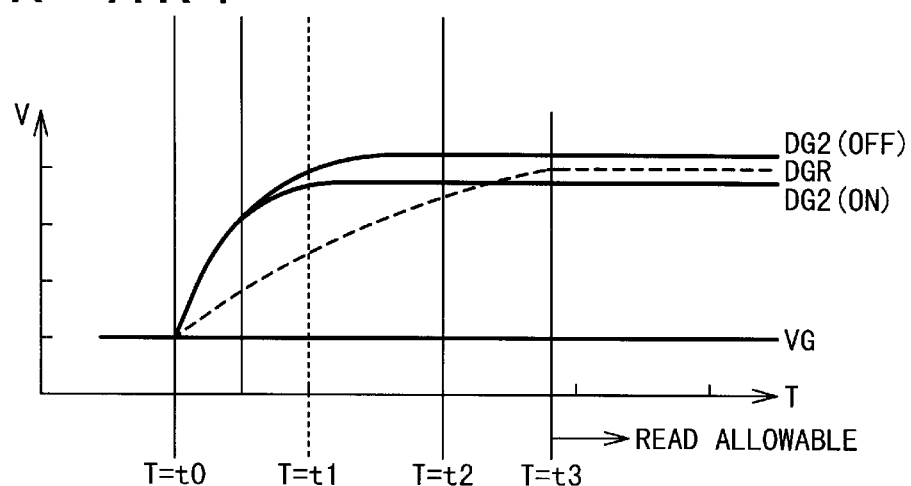

The reference memory cell matrix 13 has reference memory cells having the same size as the memory cells of the memory cell matrix 9 and arranged in the same manner. The reference memory cell matrix 13 has reference memory cells corresponding to a basic repetition unit at least. For example, as in the conventional examples shown in FIGS. 5, 7 and 9, the basic repetition unit is composed of 64 word lines 96, 5 digit lines 78 and 3 virtual ground lines 85. It is enough to provide (64×8) memory cells as the reference memory cells at least, because 8 memory cells are the basic repetition unit. However, it is desirable to provide all the (64×22) memory cells which are connected with the digit lines 78 and the virtual ground lines 85 such that resistances and parasitic capacities of the digit lines 78 and virtual ground lines 85 in the memory cell matrix 9 are equal to those of the digit lines and virtual ground lines in the reference memory cell matrix 13. The word line selection signals W00 to W63 and the bank selection signals BS1 to BS6 in the reference memory cell matrix 13 are the same as those of the memory cell matrix 9.

The RDP selector 12 selects one of the reference digit lines in accordance with the address signal AD and supplies a reference digit line signal DGR to the sensing circuit 15. Also, the RDP selector 12 selects another of the reference digit lines in accordance with the address signal AD and supplies the reference precharge signal PCR to the selected digit line.

The RV selector 14 selects one of the reference virtual ground lines in accordance with the address signal AD and connects the selected reference virtual ground line to the ground potential. Also, the RV selector 14 selects another of the reference virtual ground lines in accordance with the address signal AD, and supplies a reference precharge signal PCR as a precharge voltage to the selected reference virtual ground line.

Next, the operation of the reference memory cell section 11 will be described with reference to FIG. 15.

When the address signal AD is inputted to the address buffer 1 from an external unit, the X decoder 5 decodes the address signal AD and activates one of the word lines. Also, the bank decoder 4 decodes the address signal AD and activates one of the bank selection signal BS1 to BS6. These activated word line selection signal W00 to W63 and the activated bank selection signal BS1 to BS6 are supplied to the memory cell matrix 9 and the reference memory cell matrix 13.

On the other hand, the RDP selector 12 supplies a reference read bias voltage from the sensing circuit 15 to the reference digit line which is selected in accordance with the address signal AD such that the reference read bias voltage is supplied to a selected reference memory cell which is selected in accordance with the address signal AD. Also, the RV selector 14 connects the reference virtual ground line which is selected in accordance with the address signal AD, to the ground potential such that the selected reference memory cell is connected to the ground potential. As a result, the reference read current, i.e., the reference digit line signal DGR flows in accordance with the threshold of the selected reference memory cell.

It should be noted that a precharging circuit (not shown) supplies reference precharge signals PCR to the reference digit line and the reference virtual ground line which are selected in accordance with the address signal AD. Thus, the neighbor reference memory cells to the selected reference memory cell is biased to a predetermined voltage. As a result, it can be prevented that the reference read signal DGR leaks through the neighbor reference memory cells other than the selected reference memory cell.

FIG. 16 shows the detailed structure of the reference memory cell section 11. The reference memory cell section 11 is composed of a reference memory cell array 18 and first and second RV selectors 16 and 17. The reference memory cells RCEL having the same size as those of the memory cell array 58 shown in FIG. 1 are arranged in the reference memory cell array 18 in a matrix. A plurality of word lines W00 to W63 are arranged into the horizontal direction in the figure, and the word lines function as the gates of the plurality of the reference memory cells RCEL. Also, a plurality of reference digit line diffusion wiring lines 19 are arranged into the vertical direction in the figure, and function as the drains of the reference memory cells RCEL. Also, a plurality of virtual ground (GND) diffusion wiring lines are arranged into the vertical direction in the figure and function as the sources of the reference memory cells RCEL. The reference digit line diffusion wiring line 19 and the virtual ground diffusion wiring line 20 are alternately arranged, and are connected with the first and second RV selectors 16 and 17, respectively.

In the reference memory cells RCEL, (64 rows)×(8 columns) RCEL1 to RCEL8 are used for the generation of the reference digit line signal DGR in FIG. 16. Therefore, it is sufficient to provide (64×8) reference memory cells corresponding to the basic repetition units at least. However, in this embodiment, the (64×22) reference memory cells RCEL are provided. By this, the resistances and parasitic capacities of the reference digit line 21 and reference virtual ground line 22 are made equal to those of the digit line and virtual ground line in the memory cell array 58 shown in FIG. 1.

The first RV selector 16 is composed of a plurality of bank selection transistors BT1 and BT2. The gate of each of the transistors BT1 and BT2 is connected with the bank decoder 4 shown in FIG. 15. The bank selection signals BS1 and BS2 are supplied to the transistors BT1 and BT2, respectively. The drain of each of the transistors BT1 and BT2 is connected with the RDP selector 12 through one of the reference digit terminals RD0 to RD4 and the reference digit line 21. The source of each of the transistors BT1 and BT2 is connected with the reference memory cells RCEL through the RD diffusion wiring line 19. In this embodiment, the two reference digit line diffusion wiring lines 19 are connected with one reference digit line 21. One of the two reference digit line diffusion wiring lines 19 is connected with the reference digit line 21 by the two bank selection transistors BT1 and BT2. The number of bank selection transistors is not limited to two. Depending on the structure of the memory cell matrix 9 shown in FIG. 15, three or more reference digit line diffusion wiring lines 19 may be connected with one reference digit line 21.

The second RV selector 17 is composed of a plurality of bank selection transistors BT3 to BT6. The bank selection signals BS3 to BS6 are supplied to the bank selection transistor BT3 to BT6, respectively. The gate of each of the transistors BT3 to BT6 is connected with the bank decoder 4 shown in FIG. 15. The source of each of the transistors BT3 to BT6 is connected with the RV selector 14 through one of the reference virtual ground terminals RVG1 to RVG3 and one of the reference virtual ground lines 22. The drain of each of the transistors BT3 to BT6 is connected with the reference memory cells RCEL through the virtual ground diffusion wiring line 20. In this embodiment, four reference virtual diffusion wiring lines 20 are connected with one reference virtual ground line 22. One of the four reference virtual diffusion wiring lines 20 is connected with the reference virtual ground line 22 by the four bank selection transistors BT3 to BT6. It should be noted that the number of bank selection transistors is limited to four. Depending upon the structure of the memory cell matrix 9 shown in FIG. 15, five or more reference virtual diffusion wiring lines 20 may be connected to one reference virtual ground line 22.

The source and drain of each of the memory cell transistors and bank selection transistors are formed of diffusion layers and the gate thereof is formed of a polysilicon layer. The reference digit line terminals RD0 to RD4 and reference virtual ground terminals RVG1 to RVG3 are formed of contacts. The reference digit line terminals are connected with the reference digit line diffusion wiring lines 19 and the reference digit lines 21 which are metal wiring line layers. Also, the reference virtual ground terminals RVG1 to RVG3 are connected with the reference virtual ground line diffusion wiring lines 20 and the reference virtual ground lines 22 which are formed of metal wiring line layers.

Figure 7:
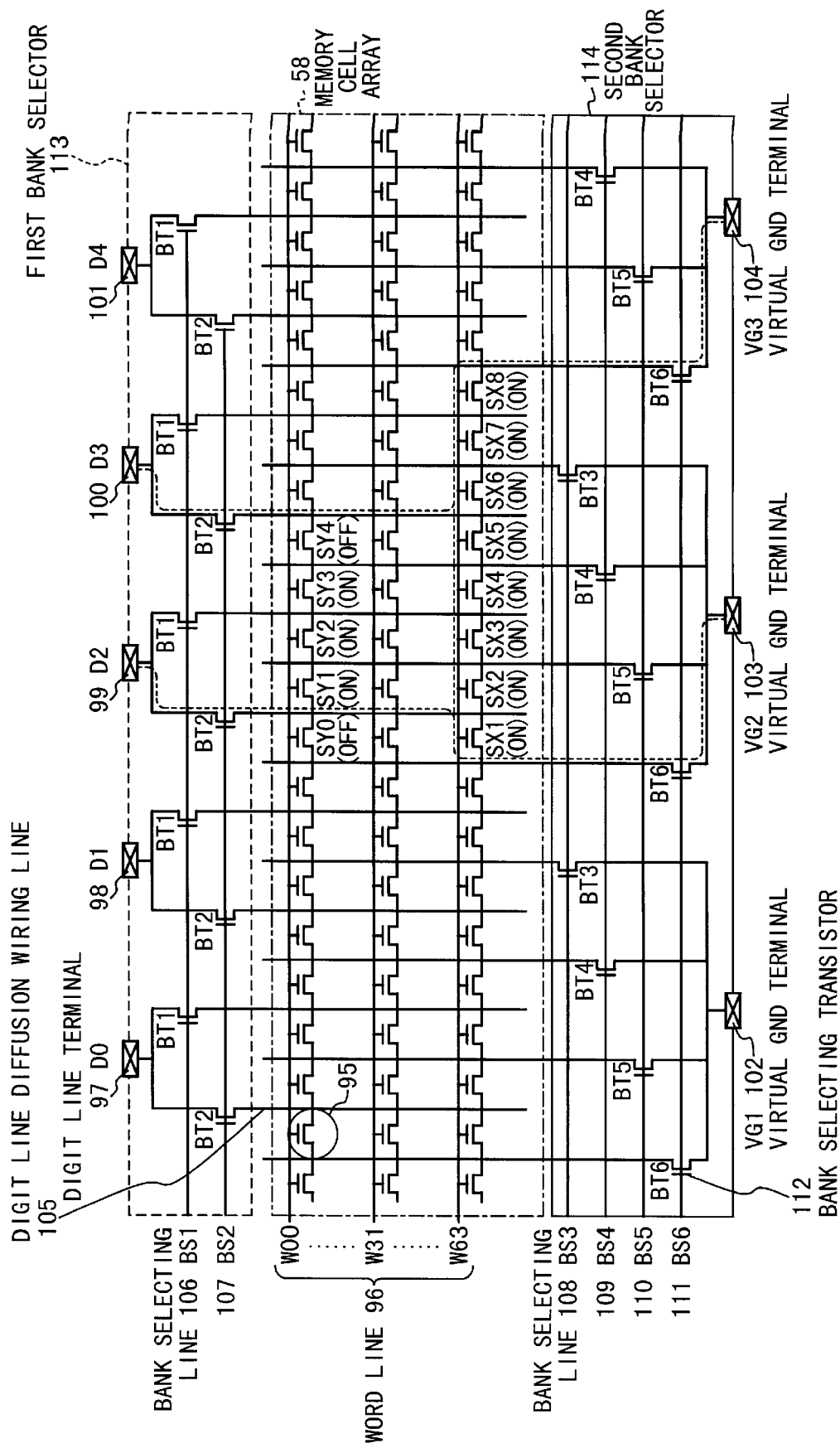
FIG. 7 is a detailed circuit diagram of the memory cell matrix section in the conventional example of the semiconductor memory device.

Because the selecting operation of one of the reference memory cells RCEL1 to RCEL8 is same as the selecting operation of one of the memory cells SX1 to SX8 shown in FIG. 7 in the conventional memory cell matrix 59 shown in FIG. 1. Also, the relation of the address signal AD and the bank selection signals BS1 to BS6 is the same as that of the truth table shown in FIG. 8. Therefore, the detailed description is omitted.

Figure 17:
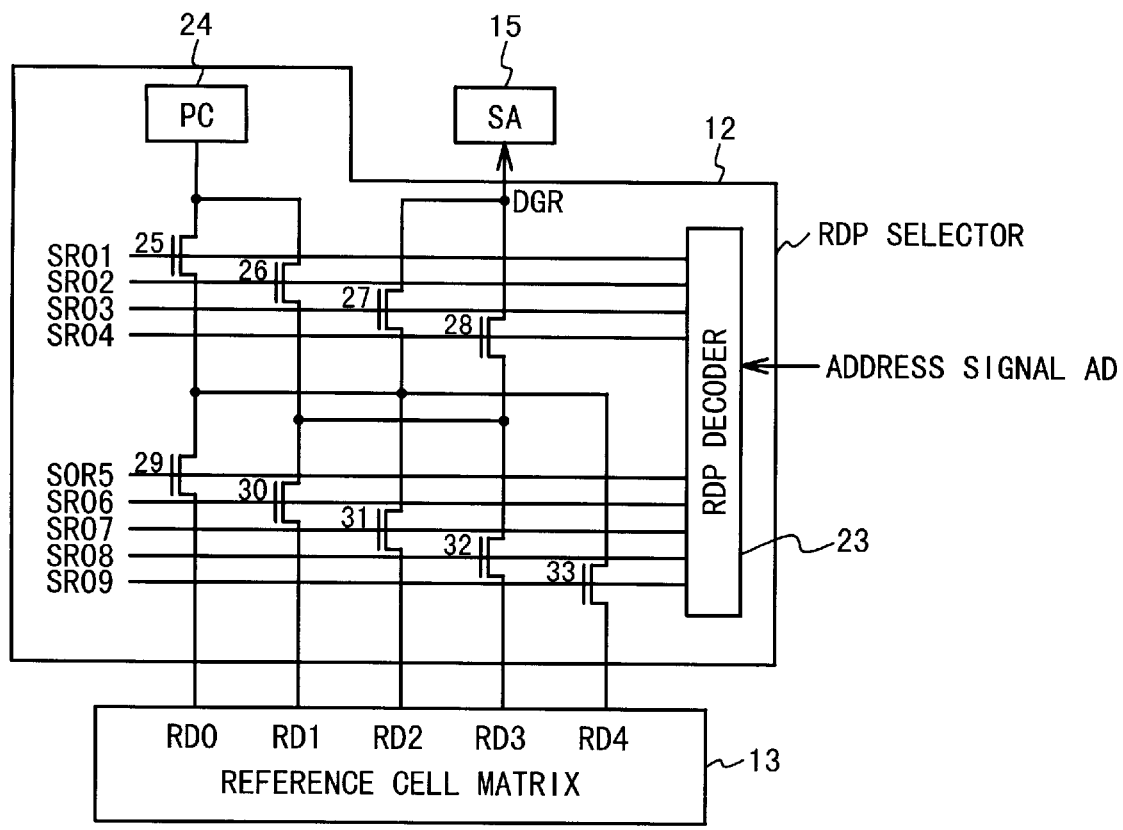
FIG. 17 is a block diagram showing an RDP selector in the semiconductor memory device according to the first embodiment of the present invention.

FIG. 17 shows the detailed circuit diagram of the RDP selector 12, and FIG. 18 shows the truth table of the RDP decoder. As shown in FIG. 17, the RDP selector 12 is composed of an RDP decoder 23, a precharging circuit 24 and transistors 25 to 33.

The RDP decoder 23 decodes lower 3 bits (a2, a1 and a0) of the address signal AD to output the selection signals SR01 to SR09. The selection signals SR01 to SR09 are connected with the gates of the transistors 25 to 33, to set predetermined ones of the transistors 25 to 33 to the conductive state/non-conductive state, respectively.

The precharging circuit 24 has the same structure as the precharging circuit 10 shown in FIG. 15. The precharging circuit 24 supplies a predetermined bias voltage as a PCR signal to the reference digit line 21 neighbor to the selected reference digit line 21 on the side of the drain of the selected reference memory cell transistor RCEL as shown in FIG. 16.

The selection transistors 27 and 28 supply the reference bias voltage from the sensing circuit 15 to one of reference digit lines RD0, RD2 and RD4 of a first group and of reference digit lines RD1 and RD3 of a second group in accordance with the selection signals SR03 and SR04. Also, the selection transistors 27 and 28 supply the reference read current flowing through the selected reference memory cell RCEL to the sensing circuit 15.

The selection transistors 25 and 26 supplies the reference precharge signal PCR in accordance with the selection signals SR01 and SR02, from the precharging circuit 24 to one the reference digit lines RD0, RD2 and RD4 or reference digit lines RD1 and RD3 of one of the first and second groups, which is not selected by the selection transistors 27 and 28. Therefore, when the selection signal SR01 is in the high level, the selection signal SR04 is also in the high level, and the selection signals SR02 and SR03 are in the low level. Oppositely, when the selection signal SR01 is in the low level, the selection signal SR04 is also in the low level, and the selection signals SR02 and SR03 are in the high level as shown in FIG. 18.

The selection transistors 29, 31 and 33 supply the reference bias voltage signal or the reference precharge signal PCR to one of the reference digit lines RD0, RD2 and RD4 of the first group in accordance with the selection signals SR05, SR07 and SR09. The selection transistors 30 and 32 supply the reference bias voltage signal or the reference precharge signal PCR to one of the reference digit lines RD1 and RD3 of the second group in accordance with the selection signals SR06 and SR08 shown in FIG. 18.

As shown in FIG. 18, for example, when the reference memory cell RCEL7 is selected, the reference digit line RD3 is electrically connected with the sensing circuit 15, and the reference digit line RD4 is electrically connected with the precharging circuit 24. It should be noted that this means that the sensing circuit 15 is connected with one of the reference digit lines RD0 to RD4 and that the precharging circuit 24 is connected with another of the reference digit lines RD0 to RD4. At this time, the selection signals SR01, SR04, SR08 and SR09 go to the high level and the other selection signals SR02, SR03, SR05 and SR07 go to the low level. As a result, the transistors 28 and 32 are turned on to supply the reference bias voltage signal from the sensing circuit 15 to the reference digit line RD3. Also, the transistors 28 and 32 supply the reference digit line signal DGR flowing through the selected reference memory cell RCEL7 to the sensing circuit 15. Also, the transistors 25 and 33 are set to the conductive state to supply the reference precharge signal PCR from the precharging circuit 24 to the neighbor reference digit line RD4.

When another reference memory cell RCEL is selected, the selection signals SR01 to SR09 are outputted in accordance with the truth table shown in FIG. 18, and the transistors 25 to 33 are set to the conductive state/non-conductive state.

FIG. 19 shows the detailed circuit diagram of the RV selector 14, and FIG. 20 shows the truth table of an RV decoder 34. As shown in FIG. 19, the RV selector 14 is composed of the RV decoder 34, a precharging circuit 35 and transistors 36 to 42.

The RV decoder 34 decodes lower 3 bits (a2,a1,a0) of the address signal and outputs the selection signals SR10 to SR16. The selection signals SR10 to SR16 are connected with the gates of the transistors 36 to 42 and set predetermined ones of the transistors 36 to 42 to the conductive state/non-conductive state.

The precharge circuit 35 has the same structure as that of the precharging circuit 10 shown in FIG. 15, and supplies a predetermined precharge bias voltage as the reference precharge signal PCR to the neighbor reference virtual ground line 22 to the selected reference virtual ground line on the side of the drain of the selected reference memory cell RCEL.

The selection transistors 41 and 42 supply the ground potential to one of reference virtual ground lines RVG1 and RVG3 of a first group and reference virtual ground lines RVG2 of a second group in accordance with the selection signals SR15 and SR16. The selection transistors 39 and 40 supply the reference precharge signal PCR in accordance with the selection signals SR13 and SR14, from the precharging circuit 35 to one of the reference virtual ground lines RVG1 and RVG3 and the reference virtual ground line RVG2, of the group which is not selected by the selection transistors 41 and 42. Therefore, when the selection signal SR13 is in the high level, the selection signal SR15 is also in the high level and the selection signals SR14 and SR16 are in the low level. Oppositely, when the selection signal SR13 is in the low level, the selection signal SR15 is in the low level and the selection signals SR14 and SR16 are in the high level as shown in FIG. 20.

The selection transistors 36 and 38 supply the ground potential GND or the reference precharge signal PCR to either one of the reference virtual ground line RVG1 and RVG3 of the first group in accordance with the selection signals SR10 and SR12. The selection transistor 37 supplies either of the ground potential GND or the reference precharge signal PCR to the reference virtual ground line RVG2 of the second group in accordance with the selection signal SR11.

As shown in FIG. 20, for example, when the reference memory cell RCEL7 is selected, the reference virtual ground line RVG2 is electrically connected with the ground potential and the reference virtual ground terminal RVG3 is electrically connected with the precharging circuit 35. It should be noted that this means the either one of the reference virtual ground terminals RV1 to RVG3 is connected to the precharging circuit 35. At this time, the selection signals SR11, SR12, SR13 and SR15 go to the high level and the other selection signals SR10, SR14 and SR16 go to the low level. As a result, the transistors 37 and 41 are set to the conductive state, the reference virtual ground line RVG2 is set to the ground potential to allow the reference digit line signal DGR to flow through the reference memory cell RCEL7. Also, the transistors 38 and 39 are set to the conductive state to supply the reference precharge signal PCR from the precharging circuit 35 to the reference virtual ground line RVG3.

When another reference memory cell RCEL is selected, the selection signals SR10 to SR16 are outputted in accordance with the truth table shown in FIG. 20, and each of the transistor 36 to 42 is set to the conductive state or the non-conductive state.

Referring to FIG. 16 again, the reference digit line 21 and the reference virtual ground line 22 are formed of metal wiring line layers, and arranged on the chip of the semiconductor memory device in parallel over a long distance. Therefore, the reference digit line 21 and the reference virtual ground line 22 undergo the influence of coupling noise depending on the potential of the neighbor line. The magnitude of the coupling noise depends on the position of the selected one of the reference memory cells RCEL1 to RCEL8. In the bank selector structure of this embodiment, there are three kinds of patterns as shown in the item of "PAT" of the truth table shown in FIGS. 18 and 20.

In the semiconductor memory device according to the first embodiment of the present invention, the reference memory cell matrix 13 has the same structure as the basic unit structure of the memory cell matrix 9. Also, the selection signals of the reference memory cell RCEL are equivalent to those of the memory cell. Therefore, the rising time of the signal on the digit line and the rising time of the signal on the reference digit line can be substantially synchronous with each other.

Also, even if the rising time of the signal on the digit line changes in accordance with the address signal AD, the rising time of the reference digit line also changes in the same manner. As a result, as shown in FIG. 21A, the reference digit line signal DGR becomes substantially equal to the middle value of the digit line signal DG1(ON) generated from the selected memory cell in the ON state and the digit line signal DG1(OFF) generated from the selected memory cell in the OFF state.

Also, as shown in FIG. 21B, even if the rising time of the digit line signal DG2(ON) generated from the selected memory cell in the ON state or the digit line signal DG2 (OFF) generated from the selected memory cell in the OFF state become fast due to large influence of the coupling noise, the reference digit line signal DGR receives approximately identical coupling noise. Therefore, the reference digit line signal DGR rises up rapidly in accordance with the middle value of these signals.

In this way, there is no case that the sensing time of the storage data is limited depending on the rising time of the digit line signal DG and the rising time of the reference digit line signal DGR, unlike the conventional example. As a result, the storage data can be always sensed if the potential difference between the digit line signal DG and the reference digit line signal DGR becomes larger than a predetermined value. Moreover, because the digit line signal DG and the reference digit line signal DGR rise up similarly, the probability of erroneous sensing can be remarkably reduced, compared with the conventional example.

[Second Embodiment]

Figure 22:
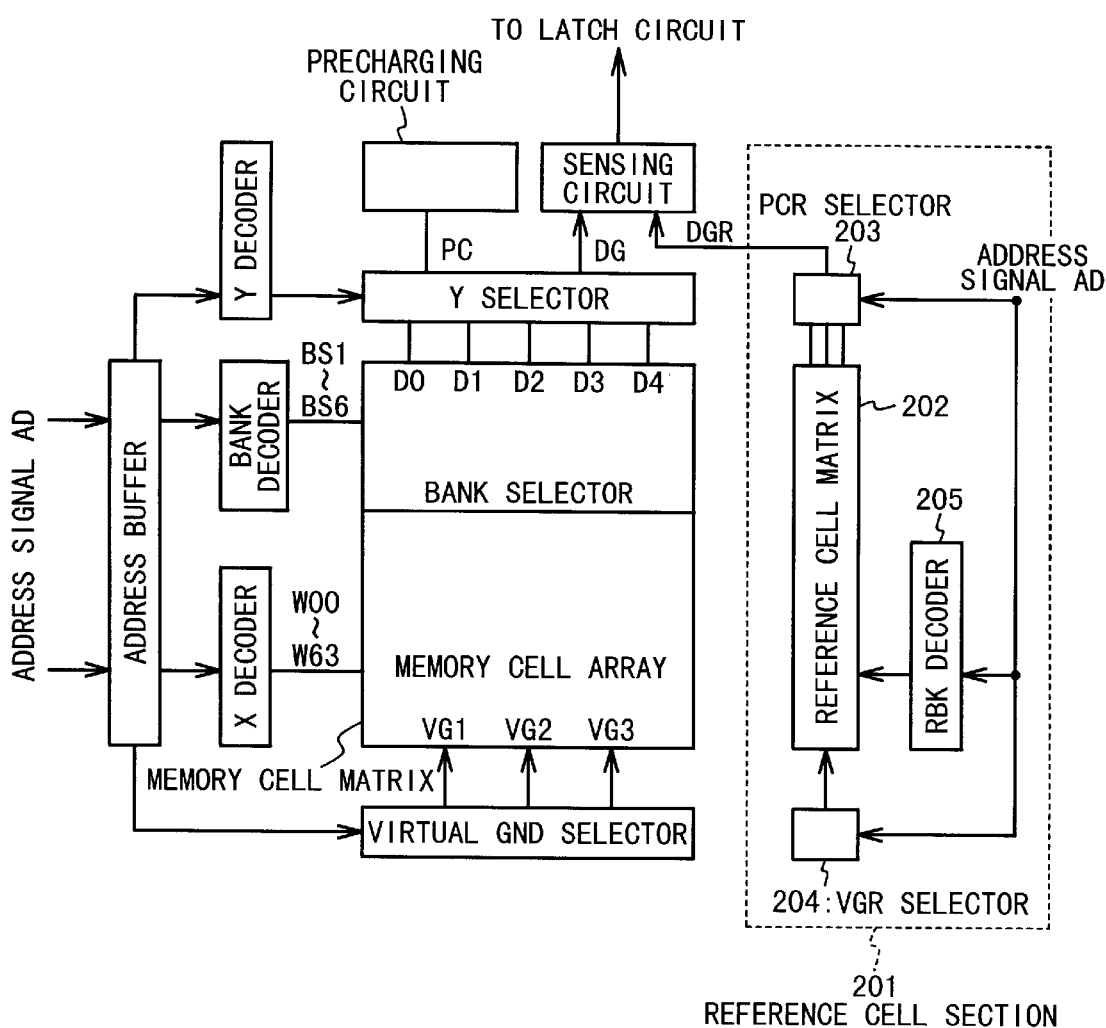
FIG. 22 is a block diagram showing the semiconductor memory device according to a second embodiment of the present invention.
Figure 23:
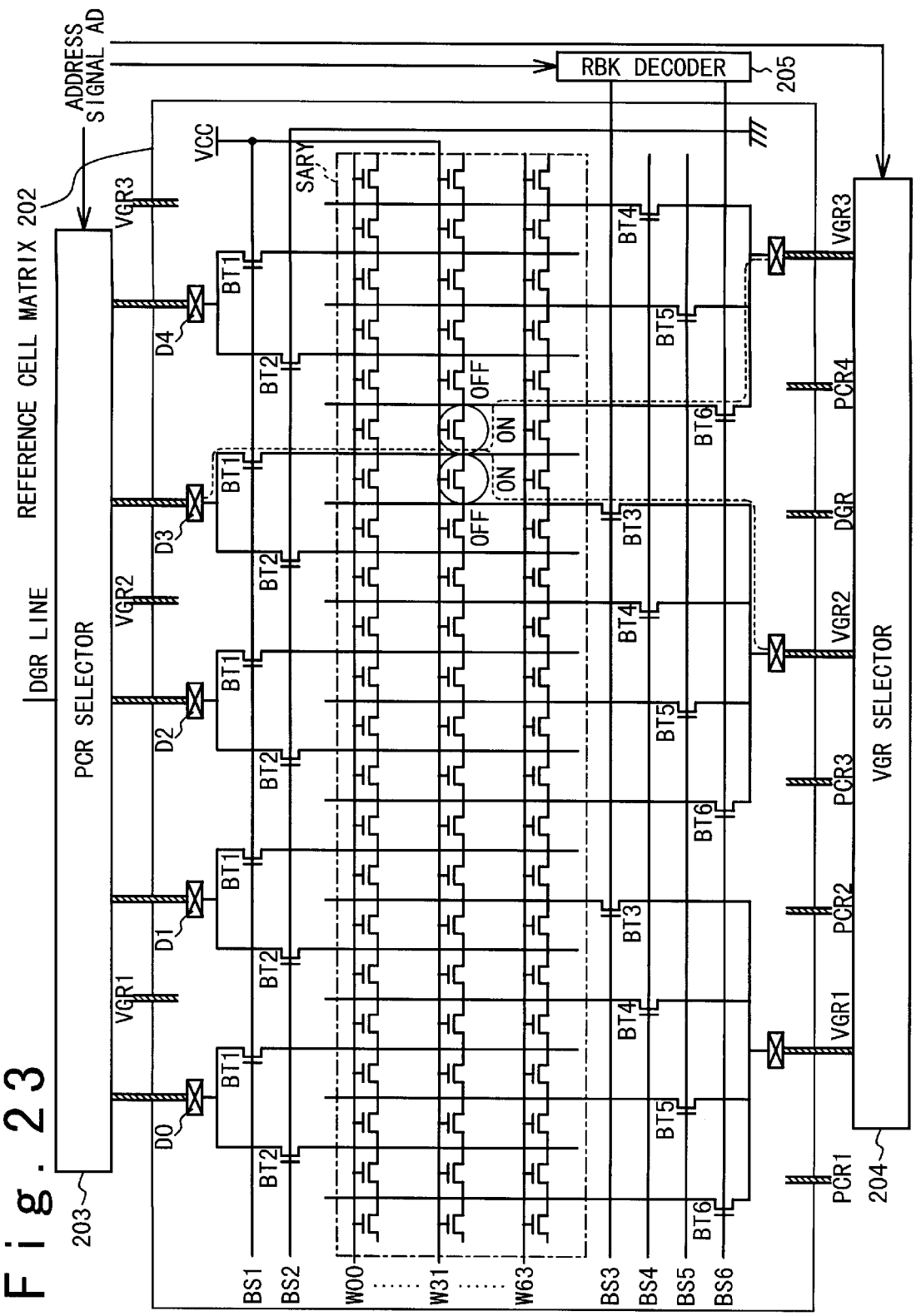
FIG. 23 is a circuit diagram showing a reference memory cell matrix section in the semiconductor memory device according to the second embodiment of the present invention.
Figure 24A:
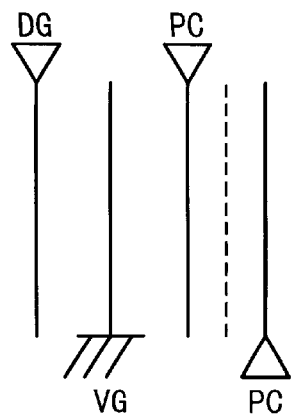
FIGS. 24A to 24C are diagrams showing three line arrangement patterns when coupling noise influence to a digit line, in the semiconductor memory device according to the second embodiment of the present invention.
Figure 24B:
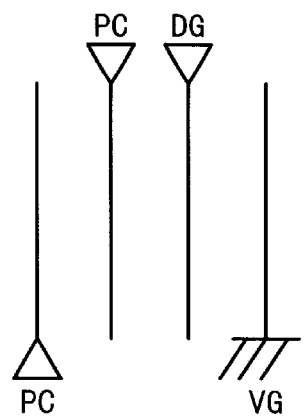
Figure 24C:
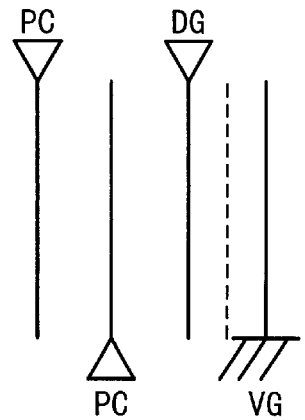

FIG. 22 is a block diagram of a reading section in the semiconductor memory device according to the second embodiment of the present invention. FIG. 23 is a circuit diagram of the reference memory cell matrix, a PCR selector and a VGR selector in the semiconductor memory device according to the second embodiment of the present invention. FIGS. 24A to 24C are line arrangement pattern diagram showing a relative arrangement of a line through which a sense current is flowing, a line which is connected with the virtual ground terminal, and a line which is connected with the precharging circuit, in the memory cell section in the semiconductor memory device according to the second embodiment of the present invention.

The structure of the semiconductor memory device according to the second embodiment of the present invention will be described with reference to FIG. 22 and FIG. 23.

Referring to FIG. 22, a reference memory cell matrix 202 is provided to input the output signal of a memory cell matrix, the output signal of the PCR selector 203, the output signal of the VGR selector 204 and the output signal of a reference bank (RBK) decoder 205. Also, a PCR selector 203 is provided to input the address signal AD and to output the reference digit line signal to the sensing circuit. Also, the VGR selector 204 is provided to input the address signal AD and the RBK decoder 205 is provided to input the address signal AD. The other components in the structure of the semiconductor memory device in the second embodiment are the same as those in the structure of the first embodiment.

The structure of the reference memory cell section 201 will be described with reference to FIG. 23. Referring to FIG. 23, five reference digit line terminals D0 to D4 are provided and six bank the selection transistors BT1 to BT6 are provided. Also, 64 word lines W00 to W63 are provided and three virtual GND terminals VG1 to VG3 are provided.

It should be noted that the number of reference digit line terminals and the number of virtual ground terminals are set to be 5 and 3 in this example, respectively. However, they are not limited to these values. The number of reference digit line terminals and the number of virtual GND terminals may be changed based on the number of reference memory cells in the reference memory cell matrix 202 and the structure of the reference memory cell matrix 202. It is desirable that the reference memory cell matrix 202 have the same structure as the memory cell matrix.

Also, the source and drain of each of the memory cell transistors and bank selection transistors are formed of diffusion layers and the gate thereof is formed of a polysilicon layer. Also, the word lines W00 to W63 and the bank selection lines BS1 to BS6 to S63 are formed of a polysilicon layer in the same way and provided to control the gate voltage of each of the memory cell transistors and bank selection transistors, respectively.

In the semiconductor memory device according to the second embodiment of the present invention, the reference memory cell matrix 202 has the same memory cell structure as the memory cell matrix. A voltage corresponding to the reference digit line signal to distinguish the ON state and the OFF state of the memory cell for a storage data to be read is generated on the reference digit line. Also, the PCR selector 203 supplies a current onto the reference precharging line, which is specified by the address signal AD, in the reference memory cell matrix 202. The VGR selector 204 sets the virtual ground terminal, which is specified by the address signal AD, to a ground potential or a predetermined voltage value in the reference memory cell matrix 202. The RBK decoder 205 applies a predetermined voltage to the bank selection line, which is specified by the address signal AD, in the reference memory cell matrix 202.

Also, the memory cell matrix and the reference memory cell matrix are arranged in such a manner that a time period from time when the address signal AD is inputted to time when the digit line signal from a memory cell reaches the input of the sensing circuit is substantially the same as the period from time when the address signal AD is inputted to time when the reference digit line signal from a reference memory cell reaches the input of the sensing circuit.

Next, the operation of the semiconductor memory device according to the second embodiment of the present invention will be described with reference to FIG. 22, FIG. 23 and FIGS. 24A to 24C.

As shown in FIGS. 22 and 23, the Y selector connects the precharging circuit and the sensing circuit in accordance with the address signal AD. The Y selector selects two of the lines connected with the memory cell matrix as a precharging line and a digit line. At that time, similarly, the PCR selector 203 selects one of the lines connected with the reference memory cell matrix 202 as the reference precharging line in accordance with the address signal AD, in the reference memory cell section 201. The reference memory cell section 201 is composed of the PCR selector 203, the VGR selector 204, the RBK decoder 205 and the reference memory cell matrix 202, as shown in FIG. 22. Also, the VGR selector 204 selects one of the lines connected with the reference memory cell matrix 202 as the virtual ground line connected with the virtual ground terminal which is grounded, in accordance with the address signal AD. Also, the VGR selector 204 a selects another of the lines connected with the reference memory cell matrix 202 as the virtual ground line connected with the virtual ground (GND) terminal with a voltage value, in accordance with the address signal AD.

The other operations of the semiconductor memory device in the second embodiment are same as those of the semiconductor memory device in the first embodiment.

Next, how the reference precharging line and the virtual ground line are selected in the semiconductor memory device in the second embodiment will be described. As shown in FIGS. 24A to 24C, the influence of the coupling noise to the current flowing line such as the digit line (DG), precharging line (PC) and the virtual ground line (VG), which have metal compositions, is different depending on the position of the memory cell for the storage data to be read out in the memory cell matrix. The influence is classified into three patterns, i.e., the first to third patterns, depending on the relative arrangement of the above lines.

In the following description, "a downward PC" indicates that a precharge signal is transferred to a precharging line through the Y selector, and "an upward PC" indicates that a precharge signal is transferred to a precharging line through the virtual ground selector.

As shown in FIG. 24A, in the first pattern, there is the digit line (DG). The virtual ground line (VG) is provided in the neighbor to the digit line to be connected with the virtual ground terminal which is grounded. Also, the precharging line (the downward PC) is provided in the neighbor to the virtual ground line. Also, the digit line in the floating state is provided in the neighbor to the precharging line, as shown by a dot line in the figure. There is a precharging line (the upward PC) connected with the virtual ground terminal with a voltage value is provided in the neighbor to the digit line in the floating state.

As shown in FIG. 24B, in the second pattern, there is a precharging line (an upward PC) connected with the virtual ground terminal. A precharging line (an downward PC) is provided in the neighbor to the precharging line connected with the virtual ground terminal. A digit line DG is provided in the neighbor to the precharging line (the downward PC) and a virtual ground line VG is provided in the neighbor to the digit line to be connected with the virtual ground terminal which is virtually grounded.

As shown in FIG. 24C, in the third pattern, there is a precharging line (the downward PC). A precharging line (the upward PC) is provided in neighbor to the precharging line to be connected with the virtual ground terminal with a voltage value. A digit line DG is provided in the neighbor to the precharging line connected with the virtual ground terminal with the voltage value. In addition, a digit line in the floating state shown by a dot line is provided in the neighbor to the digit line, and a virtual ground line VG is provided in the neighbor to the digit line in the floating state to be connected with the virtual ground terminal which is virtually grounded.

The charging operation speed of the digit line in the input terminal of the sensing circuit is different depending on these three patterns. In other words, the voltage value on the digit signal is different between the three patterns in increment for unit time before the voltage value on the digit line becomes constant.

The PCR selector 203 and the VGR selector 204 are controlled in accordance with the address signal AD such that either of the above mentioned three patterns is set. Therefore, the relative line arrangement relation of the digit line, the precharging line and the virtual ground line when a storage data is read out from a memory cell is possible to be coincident with the relative line arrangement relation of the reference digit line, the reference precharging line and the virtual ground line in the reference memory cell matrix 202 in the semiconductor memory device. In this embodiment, it is sufficient to provide at least two reference memory cells in the row direction.

In the semiconductor memory device according to the second embodiment of the present invention, the pattern of signals applied to the reference digit lines and the reference virtual ground lines can be made equivalent between the memory cell matrix and the reference memory cell matrix. Therefore, the coupling noise on the digit line and the coupling noise on the reference digit line are substantially the same. Thus, the voltage value on the reference digit line can be set to substantially the middle value between the voltage value of the ON signal and the voltage value of the OFF signal at the time when the ON signal or the OFF signal is sensed. Here, the sensing time is determined in accordance with the voltage value of the ON signal and the voltage value of the OFF signal which are transferred on the digit line. Also, the address dependence of the reading operation of the storage data from the memory cell can be eliminated. In addition, the high speed reading operation of the storage data from the memory cell can be accomplished regardless of the structure of the memory cell matrix.

Also, in the conventional example, the voltage value of a read data signal corresponding to the storage data read out from the memory cell is different in a change quantity with respect to time, depending on the coupling noise to the digit line. However, in the present invention, the read data signal can be read out from the memory cell at the theoretically earliest time as for the digit line.

Moreover, one of the memory cells form which the storage data should be read out is determined in accordance with the address signal, and one of the digit lines used for the reading operation is determined in accordance with the determined memory cell. In the present invention, therefore, the charging operation speed of the reference digit line can be controlled in accordance with the determined digit line. As a result, the read data signal corresponding to the storage data of the memory cell can be read out at the theoretically earliest time as for the digit line.

[Third Embodiment]

Figure 25:
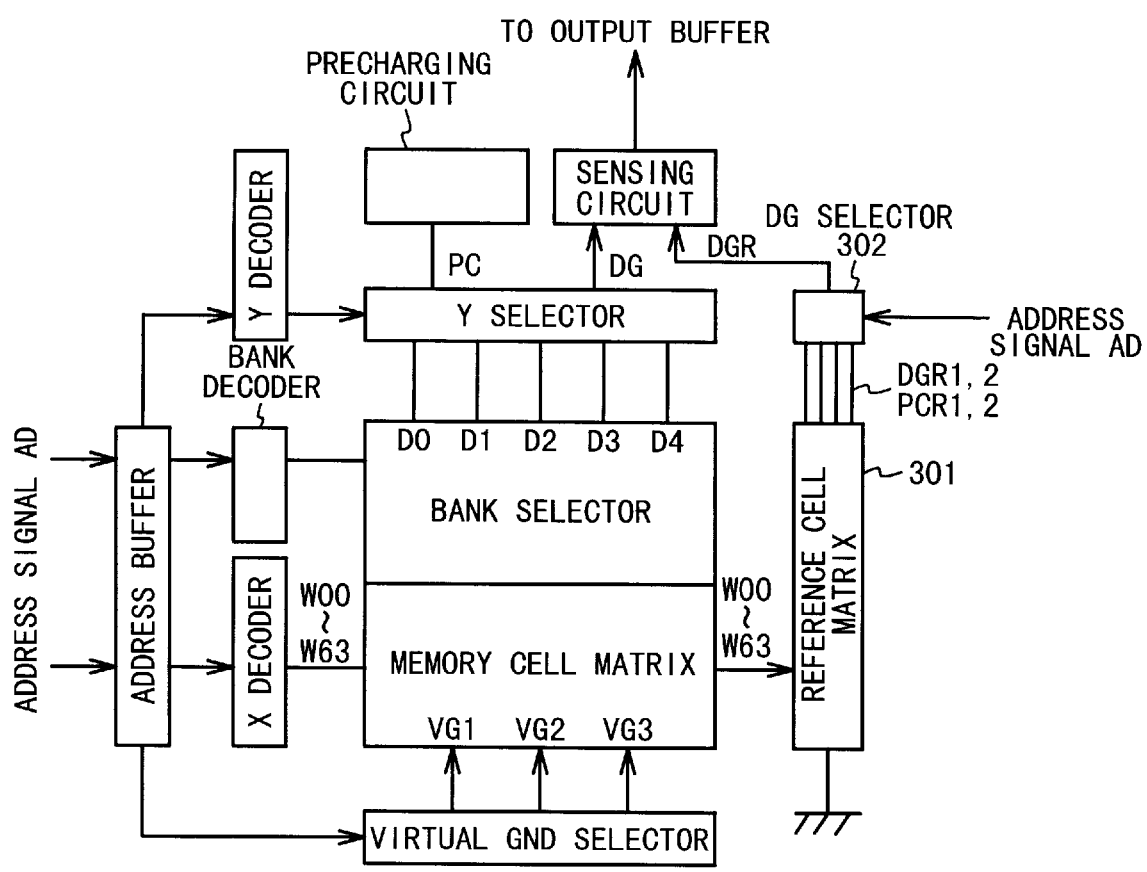
FIG. 25 is a block diagram showing the semiconductor memory device according to a third embodiment of the present invention.
Figure 26:
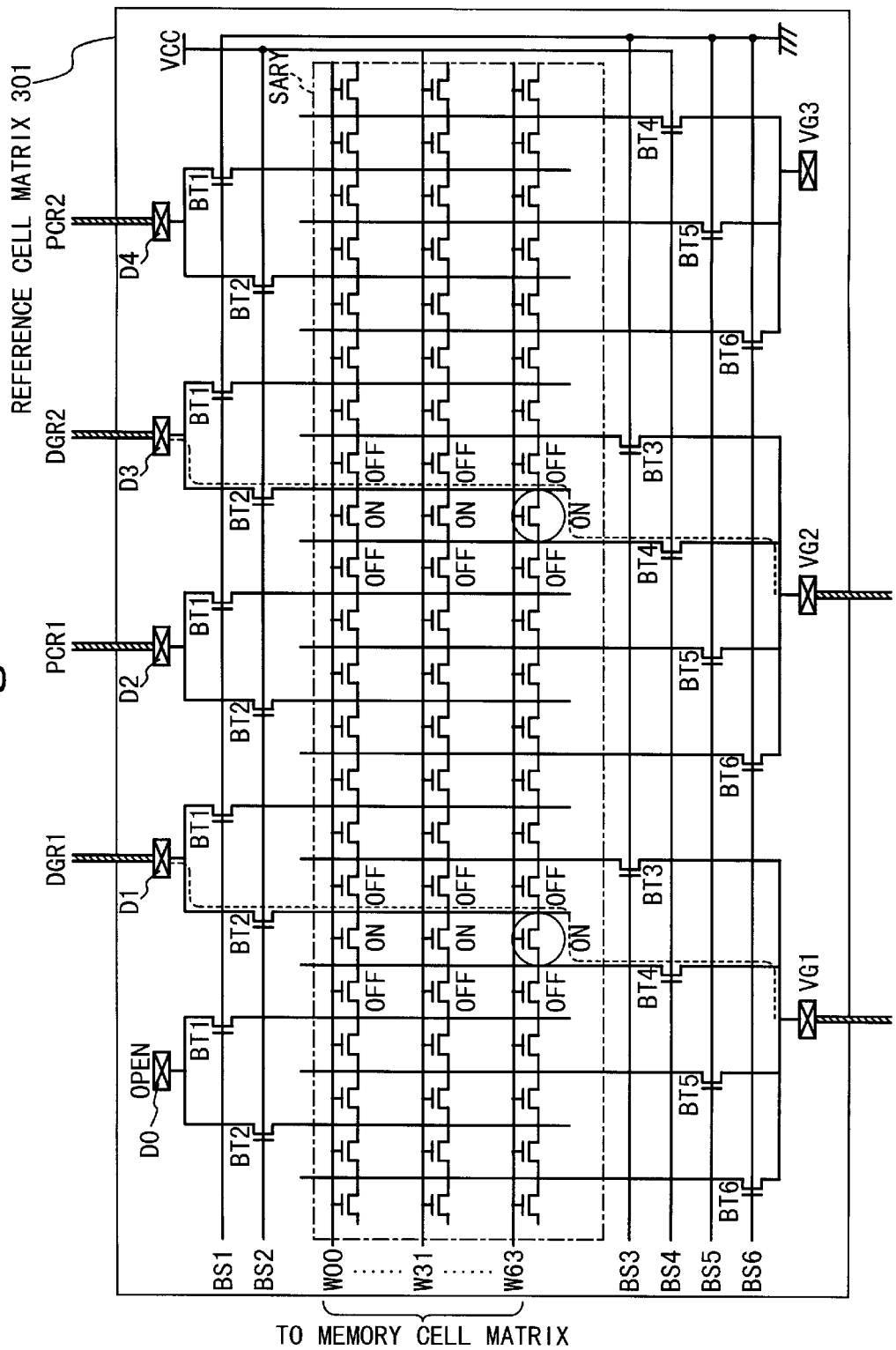
FIG. 26 is a circuit diagram showing a reference memory cell matrix section in the semiconductor memory device according to the third embodiment of the present invention.

FIG. 25 is a block diagram of the reading section in the semiconductor memory device according to the third embodiment of the present invention. FIG. 26 is a circuit diagram of the reference memory cell matrix in the semiconductor memory device according to the third embodiment of the present invention. The semiconductor memory device according to the third embodiment of the present invention will be described with reference to FIG. 25 and FIG. 26.

Referring to FIG. 25, a digit line (DG) selector 302 is provided to input the address signal AD specifying the memory cell from which the storage data should be read out. Also, two reference digit lines DGR1 and DGR2 are provided to connect the DG selector 302 and the reference memory cell matrix 301. In addition, two reference precharging lines PCR1 and PCR2 are provided to connect the DG selector 302 and the reference memory cell matrix 301. The structure of the semiconductor memory device in the third embodiment is the same as that of the semiconductor memory device in the second embodiment, except that the PCR selector and the VGR selector are not provided and except for the structure of the reference memory cell matrix 301.

In this embodiment, the two reference digit lines and the two reference precharging lines are provided, as described above. However, the number of reference digit lines or the number of reference precharging lines is not limited to two. Three or more reference digit lines and three or more reference precharging lines may be provided. In this case, when the number of reference precharging lines and the structure of the reference memory cell matrix 301 are modified in accordance with the number of reference digit lines.

The structure of the reference memory cell matrix 301 will be described with reference to FIG. 26.

Referring to FIG. 26, two reference digit lines DGR1 and DGR2 are provided, and two reference precharging lines PCR1 and PCR2 are provided. Also, two virtual ground lines are provided, 64 word lines W00 to W63 are provided and 64 reference memory cells are provided between the reference digit line DGR1 and the virtual ground line. Also, 64 reference memory cells are provided between the reference digit line DGR2 and the virtual ground line. ON cells are arranged in the column direction, OFF cells are arranged in the column direction in the neighbor to the ON cells, and ON cells are arranged in the column direction in the neighbor to the OFF cells.

By the way, the number of reference memory cells is 64 in the column direction in this embodiment. However, the number of reference memory cells is limited to 64. The number of reference memory cells may be determined in accordance with the number of memory cells in the memory cell matrix 301 and the structure of the memory cell matrix 301. Also, specific one of the word lines may be connected with power supply Vcc and the other word lines may be connected to the ground potential, as in the second embodiment.

Also, the source and drain of each of the memory cell transistors are formed of the diffusion layers and the gate thereof is formed of a polysilicon layer. Also, the word lines W00 to S63 are formed of polysilicon layers to control the gate voltage of each memory cell transistor, in the same way.

In the semiconductor memory device according to the third embodiment of the present invention, the DG selector 302 flows a current through the reference digit line which is determined in accordance with the address signal AD in the reference memory cell matrix 301. The reference cell matrix 301 generate the read data signal to the reference digit line to distinguish whether the accessed memory cell in the memory cell matrix is the ON cell or the OFF cell.

The structure of the semiconductor memory device in the third embodiment is same as that of the semiconductor memory device in the second embodiment, except that the PCR selector and the VGR selector are not provided and except for the structure the reference memory cell matrix 301.

Next, the operation of the semiconductor memory device in the third embodiment will be described with reference to FIG. 25 and FIG. 26.

As shown in FIG. 25, when the storage data is read out from the memory cell in the memory cell matrix, the DG selector 302 selects either one of two reference digit lines connected to the reference memory cell matrix 301 in accordance with the address signal AD, in the reference memory cell matrix 301 shown in FIG. 26. Also, the possible rising time patterns of the two reference digit lines (corresponding to the number of patterns in the second embodiment) in the memory cell matrix are provided in advance. In FIG. 26, two kinds of rising time patterns are provided for the reference digit lines DGR1 and DGR2. The change of the rising time can be accomplished by adjusting the wiring line resistance and parasitic capacity of the reference digit line. The DG selector 302 selects either of these reference digit lines DGR1 and DGR2 in accordance with the address signal AD. Thus, the reference digit line signal DGR can have different rising times.

The operation of the semiconductor memory device in the third embodiment is the same as that of the semiconductor memory device in the second embodiment, except that the PCR selector and the VGR selector are not provided and except for the operation of the reference memory cell matrix 301.

How the reference digit line is selected in the semiconductor memory device section in this case will be described below.

The current flowing route through the digit line and the virtual ground line which have metal compositions depends on the position of the memory cell to be read out in reference memory cell matrix 301. The relative arrangement relation of the digit line, the precharging line and the virtual ground line to influence of coupling noise is classified into first to third patterns shown in FIGS. 24A to 24C, as in the second embodiment.

The operation of the semiconductor memory device in this embodiment will be described in accordance with the above description.

One to be accessed of the memory cells is determined in accordance with the address signal AD. Therefore, the magnitude of the coupling noise in the relative arrangement relation of the digit line, the precharging line and the virtual ground line can be distinguished in accordance with the address signal AD. In this way, if a plurality of reference digit lines are provided to have different charging operation speeds in consideration of the coupling noise, an optimal one of the plurality of reference digit lines can be selected by the DG selector 302 in accordance with the address signal AD.

In the semiconductor memory device according to the third embodiment of the present invention, the plurality of reference digit lines with the different charging operation speeds are provided. Therefore, one of the plurality of reference digit lines which has the same influence of the coupling noise as the digit line can be selected. Thus, the digit line and the reference digit line have substantially the same charging operation speed. As a result, it is possible to set the voltage value of the reference digit line to substantially the middle value between the voltage value of the ON signal and the voltage value of the OFF signal at the time when it is possible to distinguish whether the read data signal is the ON signal or the OFF signal. Also, the address dependence of the reading operation speed of the memory cell data can be eliminated. In addition, the high speed reading operation of the memory cell data can be accomplished regardless of the structure of the memory cell matrix.

[Fourth Embodiment]

Figure 27:
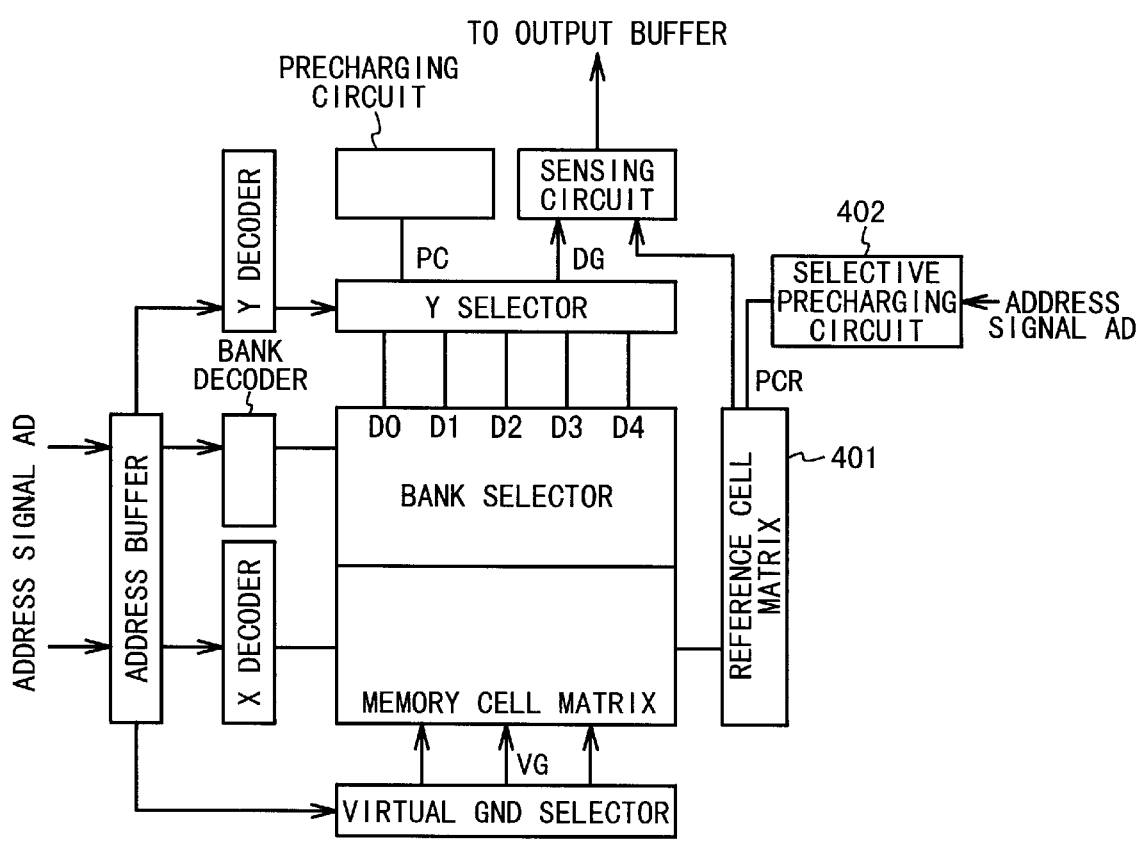
FIG. 27 is a block diagram showing the semiconductor memory device according to a fourth embodiment of the present invention.
Figure 28:
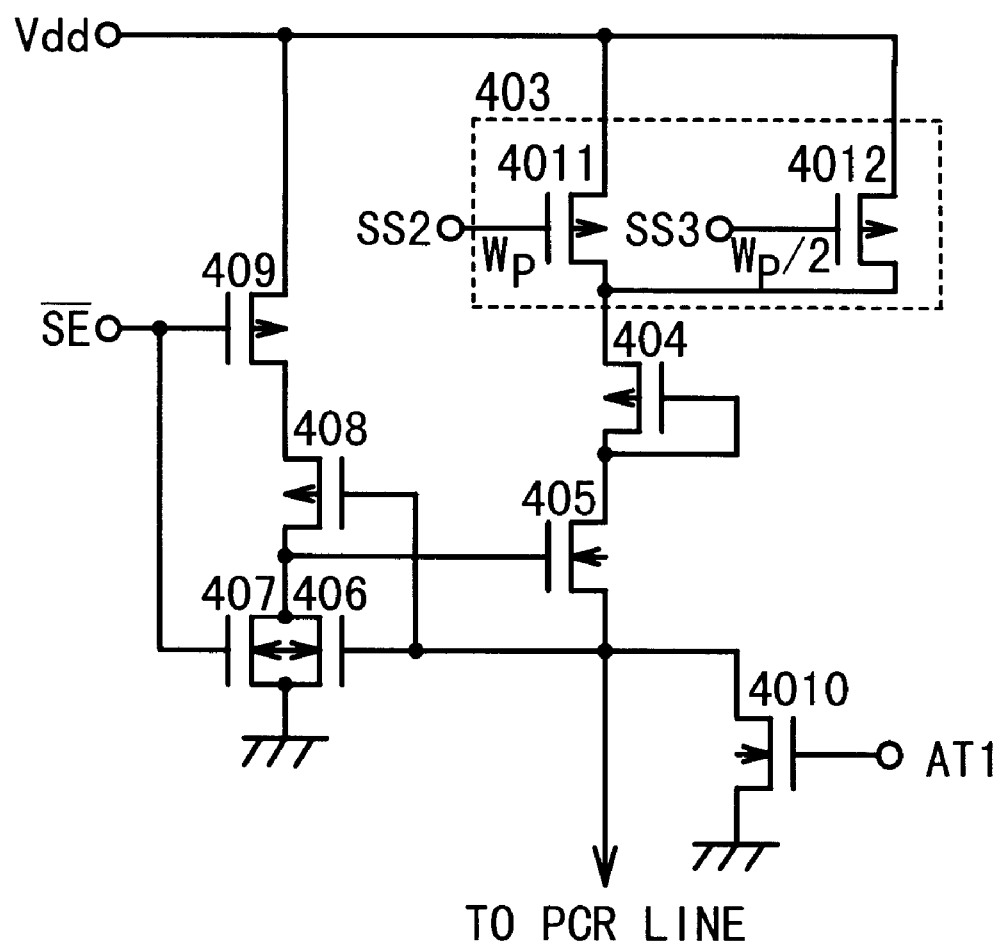
FIG. 28 is a circuit diagram showing a selective precharging circuit in the semiconductor memory device according to the fourth embodiment of the present invention.
Figure 29:
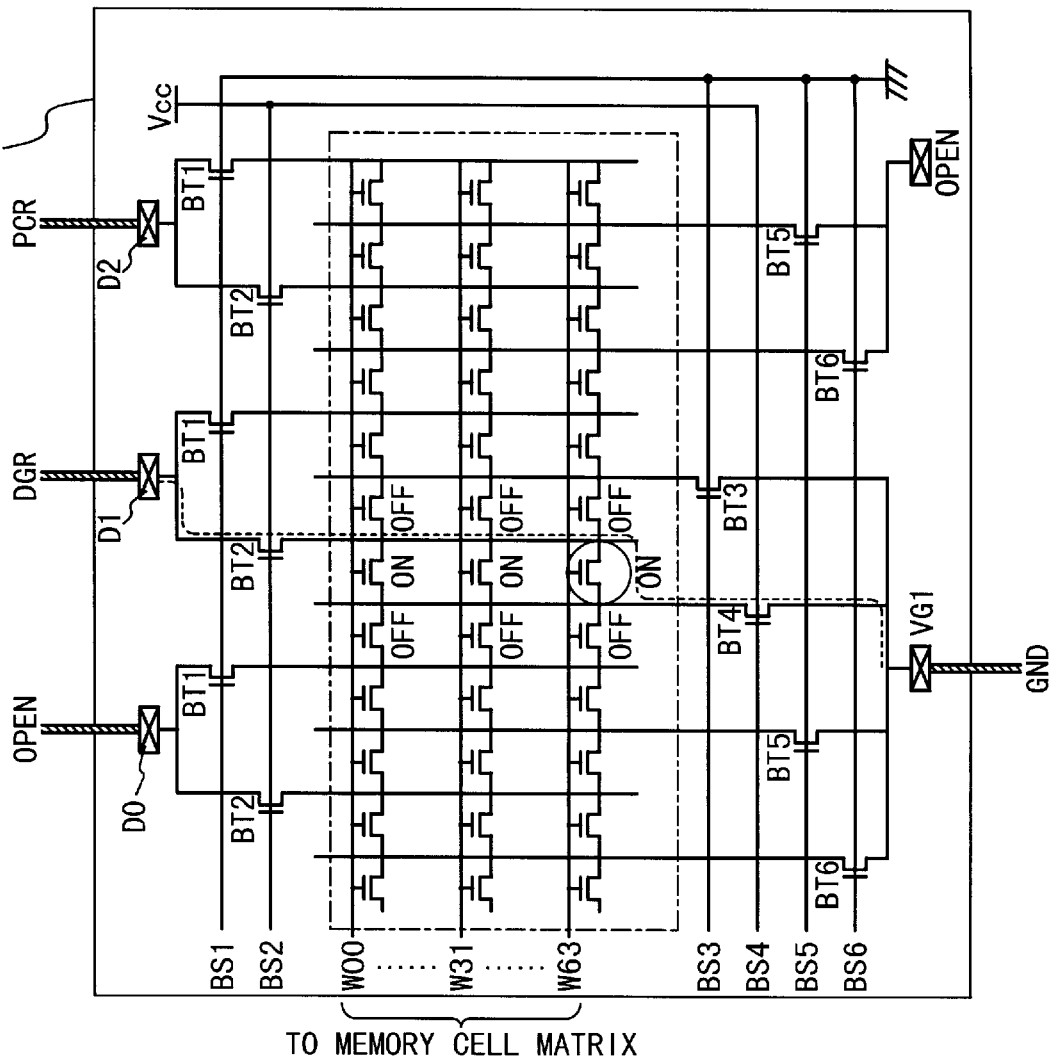
FIG. 29 is a circuit diagram showing a reference memory cell matrix section in the semiconductor memory device according to the fourth embodiment of the present invention.
Figure 30A:
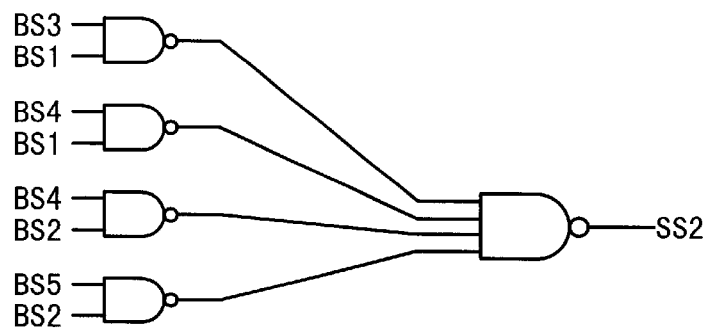
FIGS. 30A and 30B are circuit diagrams showing the structure of an address decoder of the selective precharging circuit in the semiconductor memory device according to the fourth embodiment of the present invention.
Figure 30B:
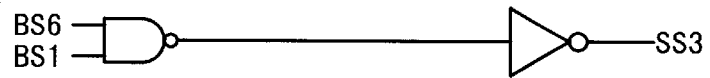

FIG. 27 is a block diagram of a reading section in the semiconductor memory device according to the fourth embodiment of the present invention. FIG. 28 is a circuit diagram showing a selective precharging circuit in the semiconductor memory device according to the fourth embodiment of the present invention. FIG. 29 is a circuit diagram showing a reference memory cell matrix in the semiconductor memory device according to the fourth embodiment of the present invention. FIGS. 30A and 30B are circuit diagrams showing the structure of an address decoder in the semiconductor memory device according to the fourth embodiment of the present invention. The structure of the semiconductor memory device according to the fourth embodiment of the present invention will be described with reference to FIG. 27, FIG. 28 and FIG. 29.

Referring to FIG. 27, the selective precharging circuit 402 is provided to input the address signal AD specifying the memory cell in the memory cell matrix. Also, a reference precharging (PCR) line is provided to connect the selective precharging circuit 402 and the reference memory cell matrix 401. The structure of the semiconductor memory device in the fourth embodiment is the same as that of the semiconductor memory device in the second embodiment, except that the PCR selector and the VGR selector are not provided and except for the structure of the reference memory cell matrix 401.

The structure of the selective precharging circuit 402 will be described with reference to FIG. 28. Referring to FIG. 28, a selecting circuit 403 is provided and a P-channel MOS transistor 404 is provided to connected with the selecting circuit 403 at the source. An N-channel MOS transistor 405 is provided to have the drain connected with the drain and gate of the P-channel MOS transistor 404 and the source connected with the reference precharging line PCR. Two N-channel MOS transistors 406 and 407 are provided to have the drains connected with the gates of the N-channel MOS transistor 405 and the sources connected with the ground potential, respectively. A P-channel MOS transistor 408 is provided to have the drain connected with the gate of the N-channel MOS transistor 405 and the gate connected with the gate of N-channel MOS transistor 406. A P-channel MOS transistor 409 is provided to have the drain connected with the source of this P-channel MOS transistor 408 and the gate connected with the gate of the N-channel MOS transistor 407. An N-channel MOS transistor 4010 is provided to have the drain connected with the drain connected with the gate of the N-channel MOS transistor 406, and the source connected with the ground potential.

Also, in the selecting circuit 403, a P-channel MOS transistor 4011 with a gate width of Wp is provided and another P-channel MOS transistor 4012 with the gate width of Wp/2 having the drain connected with the drain of the P-channel MOS transistor 4011. The control signals SS2 and SS3 are supplied to the gates of the transistors 4011 and 4012 to control the ON/OFF states of the transistors 4011 and 4012. When the control signal SS2 is in the low level, the transistor 4011 has the ability to flow current i (i shows a current value), and when the control signal SS3 is in the low level, the transistor 4012 has the ability to flow current i/2. Also, the control signals SS2 and SS3 are both in the low level, the transistors 4011 and 4012 have the ability to flow current 3i/2 together. The reference precharging line PCR is charged with the current drive ability determined in this way.

The structure of the reference memory cell matrix 401 will be described with reference to FIG. 29.

The reference digit line DGR, the reference precharging line PCR and the virtual ground line are provided and 64 word lines W00 to W63 are provided. 64 reference memory cells are provided between the reference digit line DGR and the virtual ground line and 64-row reference memory cells are provided between the reference digit line DGR and the reference precharging line PCR. In this manner, the number of reference memory cells is set to be 64 in this embodiment. However, the number of reference memory cells is not limit to 64. The number of reference memory cells is desirably determined in accordance with the number of memory cells in the memory cell matrix or the structure of the memory cell matrix.

Also, the source and drain of each of the memory cell transistor are formed of the diffusion layers and the gate thereof is formed of a polysilicon layer. In the same way, the word lines W00 to S63 are formed of polysilicon films to control the gate current of the respective memory cell transistors.

In the semiconductor memory device according to the fourth embodiment of the present invention, the transistors

4011 and 4012 with different gate widths are provided in the selective precharging circuit 402. The transistors 4011 and 4012 flow currents to one of the reference precharging lines, which is determined in accordance with the address signal AD, in the reference memory cell matrix 401. The reference cell matrix 401 applies the voltage for distinguishing the ON signal and the OFF signal of the selected memory cell to the reference digit line.

Also, the selecting circuit 403 in the selective precharging circuit 402 is not limited to the structure in which the selecting circuit 403 is composed of the transistors with different gate widths. The selecting circuit 403 is sufficient to have a function to change the quantity of current outputted from the selecting circuit 403. For example, transistors with different gate lengths may be provided in the selecting circuit 403.

The structure of the semiconductor memory device in the fourth embodiment is the same as that of the semiconductor memory device in the second embodiment, except that the PCR selector and the VGR selector are not provided and except for the structure of the reference memory cell matrix 401.

Next, the operation of the semiconductor memory device in the fourth embodiment will be described with reference to FIG. 27, FIG. 28, FIG. 29 and FIGS. 30A and 30B.

As shown in FIG. 27, in case where the storage data is read out from the memory cell of the memory cell matrix, the following matter is carried out in the circuit section composed of the selective precharging circuit 402 and the reference memory cell matrix 401 shown in FIG. 29. That is, the selective precharging circuit 402 changes the current flowing through the precharging line PCR connected to the reference memory cell matrix 401 in accordance with the address signal AD. As a result, the coupling noise quantity to the reference digit line can be changed.

How the signal to be supplied to the selecting circuit 403 is determined in accordance with the address signal AD will be described below with reference to FIGS. 30A and 30B.

The bank selection signals to be transferred to the bank selection transistor are determined in accordance with the address signal AD and two of the bank selection signals are supplied to a NAND circuit. More specifically, the NAND circuit inputs the bank selection signal 3 BS3 and the bank selection signal 1 BS1, and outputs a signal S1 (not shown). The NAND circuit inputs the bank selection signal 4 BS4 and the bank selection signal 1 BS1 and outputs a signal S2 (not shown). The NAND circuit inputs the bank selection signal 4 BS4 and the bank selection signal 2 BS2 and outputs a signal S6 (not shown). The NAND circuit inputs the bank selection signal 5 BS5 and the bank selection signal 2 BS2 and outputs a signal S7 (not shown). The NAND circuit inputs the bank selection signal 6 BS6 and the bank selection signal 1 BS1 and outputs a signal S4 (not shown).

In the following process, the NAND circuit inputs signals S1, S2, S6 and S7, and outputs a signal SS2. The NOT circuit inputs the signal S4 and outputs a signal SS3.

Next, the signal SS2 is supplied to the NOT circuit, and the output signal of the NOT circuit is outputted to the gate of the P-channel MOS transistor 4011 (FIG. 28 with the gate width of Wp of the selecting circuit 403. The signal SS3 is supplied to the NOT circuit and the output signal of the NOT circuit is supplied to the P-channel MOS transistor 4012 (FIG. 28) with the gate width of Wp/2.

The operation of the semiconductor memory device in the fourth embodiment is the same as that of the semiconductor memory device in the second embodiment, except that the PCR selector and the VGR selector are not provided and the operation of the reference memory cell matrix 401.

Next, how the charging operation speed of the reference digit line is determined in the semiconductor memory device in the fourth embodiment will be described below.

The current flowing route of the digit line, the precharging line and the virtual ground line which have metal compositions is dependent upon the position of the memory cell to be read in the memory cell matrix. The relative arrangement relation of the digit line, the precharging line and the virtual ground line to the influence of the coupling noise is classified into first to third patterns, as shown in FIGS. 24A to 24C in the second embodiment.

Next, the operation of the semiconductor memory device in the fourth embodiment will be described in consideration of the above description.

One to be read of the memory cells in the memory cell matrix is determined in accordance with the address signal AD. Thus, the magnitude of the coupling noise is determined in accordance with to the relative arrangement relation of the digit line, the precharging line and the virtual ground line and the address signal AD. Therefore, the selecting circuit 403 of the selective precharging circuit 402 inputs the address signal AD controls or adjusts the quantity of current to be supplied to the reference precharging line such that the charging operation speed of the reference precharging line is substantially equal to that of the digit line. This is because the rising time of the reference precharging line PCR is dependent on the address signal AD, and the coupling noise quantity on the reference digit line is dependent on the relative arrangement relation of the digit line, the precharging line and the virtual ground line.

In should be noted that the number of transistors for the current control in the selecting circuit 403 is determined, depending on the number of influence patterns of the coupling noise.

In the semiconductor memory device according to the fourth embodiment of the present invention, the selective precharging circuit inputs the address signal AD and sets the charging operation speed of the reference digit line, such that the charging operation speed of the digit line is substantially equal to that of the reference digit line. In this way, the voltage value of the reference digit line can be set to substantially the middle value between the voltage value of the ON signal and the voltage value of the OFF signal, at the time when it can be distinguish whether the storage data of the memory cell is the ON signal or the OFF signal. Thus, the address dependence of the reading operation speed of the memory cell data can be eliminated to allow the high speed reading operation to be attained.

As described above, according to the semiconductor memory device of the present invention, the rising time of the reference data signal on the reference digit line can be changed or adjusted in accordance with the address signal, so that the rising time of the reference data signal is substantially equal to that of the data signal from the memory cell. As a result, the storage data can be read out at high speed.

What is claimed is:

1. A semiconductor memory device comprising:
    a memory cell matrix section including memory cells arranged in a first matrix, wherein when one of said memory cells is selected based on an address signal, a read data signal corresponding to a storage data of said selected memory cell is outputted;
    a reference memory cell matrix section including a plurality of switchable reference memory cells arranged in a second matrix having a structural aspect substantially identical to said memory cell matrix to ensure that a charging speed for said reference memory cell matrix is essentially identical to a corresponding charging speed for said memory cell matrix for each said address, and outputting a reference data signal for said read data signal outputted from said selected memory cell; and a sensing circuit sensing said storage data based on said read data signal from said memory cell matrix section and said reference data signal from said reference memory cell matrix section, wherein said reference memory cell matrix section outputs said reference data signal to said sensing circuit such that, for each said memory cell matrix address, said reference data signal appears substantially synchronous with said data read signal, wherein said reference memory cell matrix section includes:

a reference memory cell matrix including said reference memory cells arranged in said second matrix, a selected one of said reference memory cells being connected to a first digit line, and remaining ones of said reference memory cells;

a first selector applying a read bias for said selected reference memory cell, and applying a first reference precharge signal for a second reference digit line connected with a first one of said non-selected reference memory cells to provide a correct current path for said reference data signal;

a first blank selector transferring said read bias to said first digit line and said first reference precharge signal to said second digit line;

a second selector applying a ground voltage and a second reference precharge signal for said reference memory cell matrix; and a second bank selector transferring said ground voltage to a third digit line connected with said selected reference memory cell and said second reference precharge signal to a fourth digit line connected with a second one of said non-selected memory cells, and wherein said reference data signal corresponds to a current flowing through said first digit line, said selected reference memory cell and said third digit line, when said read bias is applied to said selected reference memory cell.

2. A semiconductor memory device comprising:

a memory cell matrix section including memory cells arranged in a first matrix, wherein when one of said memory cells is selected based on an address signal, a read data signal corresponding to a storage data of said selected memory cell is outputted;

a reference memory cell matrix section including reference memory cells arranged in a second matrix, and outputting a reference data signal for said read data signal outputted from said selected memory cell, a selected one of said reference memory cells being connected to a first digit line, and remaining ones of said reference memory cells by non-selected reference memory cells;

a sensing circuit sensing said storage data based on said read data signal from said memory cell matrix section and said reference data signal from said reference memory cell matrix section, wherein said reference memory cell matrix section outputs said reference data signal to said sensing circuit such that said reference data signal appears substantially synchronous with said data read signal;

a first selector applying a read bias for said selected reference memory cell, and applying a first reference precharge signal for a second reference digit line connected with a first one of said non-selected reference memory cells to provide a correct current path for said reference data signal;

a first bank selector transferring said read bias to said first digit line and said first reference precharge signal to said second digit line;

a second selector applying a ground voltage and a second reference precharge signal for said reference memory cell matrix; and a second bank selector transferring said ground voltage to a third digit line connected with said selected reference memory cell and said second reference precharge signal to a fourth digit line connected with a second one of said non-selected memory cells, wherein said reference data signal corresponds to a current flowing through said first digit line, said selected reference memory cell and said third digit line, when said read bias is applied to said selected reference memory cell, wherein said memory cells are arranged to form said first matrix of basic repetition units, and wherein said reference memory cell matrix section includes said reference memory cells which are arranged to have the same structure as a basic repetition unit of said memory cells in said memory cell matrix section.

3. A semiconductor memory device comprising:

a memory cell matrix section including memory cells arranged in a first matrix, wherein when one of said memory cells is selected based on an address signal, a read data signal corresponding to a storage data of said selected memory cell is outputted;

a reference memory cell matrix section including reference memory cells arranged in a second matrix, and outputting a reference data signal for said read data signal outputted from said selected memory cell; and a sensing circuit sensing said storage data based on said read data signal from said memory cell matrix section and said reference data signal from said reference memory cell matrix section, wherein said reference memory cell matrix section outputs said reference data signal to said sensing circuit such that said reference data signal appears substantially synchronous with said data read signal, and wherein said reference memory cell matrix section includes:

a reference memory cell matrix including said reference memory cells arranged in said second matrix, a selected one of said reference memory cells being connected to a first digit line, and remaining ones of said reference memory cells being non-selected reference memory cells;

a first selector applying a read bias for said selected reference memory cell, and applying a first reference precharge signal for a second reference digit line connected with a first one of said non-selected reference memory cells based on said address signal to provide a correct current path for said reference data signal;

a first bank selector transferring said read bias to said first digit line and said first reference precharge signal to said second digit line based on said address signal;

a second selector applying a ground voltage and a second reference precharge signal for said reference memory cell matrix based on said address signal; and a second bank selector transferring said ground voltage to a third digit line connected with said selected reference memory cell and said second precharge signal to a fourth digit line connected with one of said non-selected memory cells based on said address signal, wherein said reference data signal corresponds to a current flowing through said first digit line, said selected reference memory cell and said third digit line, when said read bias is applied to said selected reference memory cell.

4. A semiconductor memory device according to claim 3, wherein said memory cells are arranged to form said first matrix of basic repetition units, and wherein said reference memory cell matrix section includes said reference memory cells which are arranged to have the same structure as a basic repetition unit of said memory cells in said memory cell matrix section.

5. A semiconductor memory device according to claim 3, wherein said first and second bank selection signals are generated based on said address signal to select said selected memory cell in said memory cell matrix section.

6. A semiconductor memory device comprising:

a memory cell matrix section including memory cells arranged in a first matrix, wherein when one of said memory cells is selected based on an address signal, a read data signal corresponding to a storage data of said selected memory cell is outputted;

a reference memory cell matrix section including reference memory cells arranged in a second matrix, and outputting a reference data signal for said read data signal outputted from said selected memory cell; and a sensing circuit sensing said storage data based on said read data signal from said memory cell matrix section and said reference data signal from said reference memory cell matrix section, wherein said reference memory cell matrix section outputs said reference data signal to said sensing circuit such that said reference data signal appears substantially synchronous with said data read signal, and wherein said reference memory cell matrix section includes:

a reference memory cell matrix including said reference memory cells arranged in said second matrix, wherein a reference digit wiring line and a reference virtual ground wiring line are alternately provided to extend in a column direction and said reference memory cells of each row are provided between said reference digit wiring line and said reference virtual ground wiring line in a row direction, one of said reference memory cells selected based on said address signal being connected to a first one of said reference digit wiring lines, and remaining ones of said reference memory cells being non-selected reference memory cells;

a third selector applying a read bias for said first reference digit wiring line connected to said selected reference memory cell, and applying a first reference precharge signal for a second one of said reference digit wiring lines connected with a first one of said non-selected reference memory cells based on one of bias patterns which is determined based on said address signal, said bias patterns being predetermined based on a first number and a second number;

a first bank selector including first bank selection transistors which are grouped in units of the first numbers, and transferring said read bias to said first digit wiring line and said first reference precharge signal to said second digit wiring line based on said address signal using said first bank selection transistors;

a second selector applying a ground voltage and a second reference precharge signal for said reference memory cell matrix based on said one bias pattern; and a second bank selector including second bank selection transistors which are grouped in units of the second numbers, and transferring said ground voltage to a first one of said virtual ground wiring lines connected with said selected reference memory cell and said second reference precharge signal to a second one of said virtual ground wiring lines connected with one of said non-selected memory cells based on said address signal using said second bank selection transistors, wherein said reference data signal corresponds to a current flowing through said first digit wiring line, said selected reference memory cell and said first virtual ground wiring line, when said read bias is applied to said selected reference memory cell.

7. A semiconductor memory device according to claim 6, wherein two of said reference memory cells connected to one of said reference digit wiring line have a same storage data.

8. A semiconductor memory device comprising:

a memory cell matrix section including memory cells arranged in a first matrix, wherein when one of said memory cells is selected based on an address signal, a read data signal corresponding to a storage data of said selected memory cell is outputted;

a reference memory cell matrix section including reference memory cells arranged in a second matrix, and outputting a reference data signal for said read data signal outputted from said selected memory cell; and a sensing circuit sensing said storage data based on said read data signal from said memory cell matrix section and said reference data signal from said reference memory cell matrix section, wherein said reference memory cell matrix section outputs said reference data signal to said sensing circuit such that said reference data signal appears substantially synchronous with said data read signal, and wherein said reference memory cell matrix section includes:

a plurality of reference digit lines which have different resistance and different parasitic capacities, respectively;

a plurality of virtual ground lines connected to a ground potential;

a reference memory cell matrix including said reference memory cells arranged in said second matrix, wherein a reference digit wiring line and a reference virtual ground wiring line are alternately provided to extend in a column direction and said reference memory cells of each row are provided between said reference digit wiring line and said reference virtual ground wiring line in a row direction, one of said reference memory cells selected based on said address signal being connected to a first one of said reference digit wiring lines, and remaining ones of said reference memory cells being non-selected reference memory cells;

a fifth selector selecting a first one of said plurality of reference digit lines and a second one of said plurality of reference digit line, applying a read bias for said first reference digit line to be connected to said selected reference memory cell, and applying a first reference precharge signal for said second reference digit line connected with a first one of said non-selected reference memory cells based on one of bias patterns which is determined based on said address signal, said bias patterns being predetermined based on a first number and a second number;

a first bank selector including first bank selection transistors which are grouped in units of the first numbers, and transferring said read bias from said first reference digit line to said first digit wiring line and said first reference precharge signal from said second digit line to a second one of said digit wiring lines based on said address signal using said first bank selection transistors; and a second bank selector including second bank selection transistors which are grouped in units of the second numbers, and connecting said ground voltage to a first one of said plurality of virtual ground wiring lines connected with said selected reference memory cell and a second reference precharge signal to a second one of said plurality of virtual ground wiring lines connected with one of said non-selected memory cells based on said address signal using said second bank selection transistors, wherein said reference data signal corresponds to a current flowing through said first reference digit line, said first digit wiring line, said selected reference memory cell and said first virtual ground wiring line, when said read bias is applied to said selected reference memory cell.

9. A semiconductor memory device according to claim 8, wherein two of said reference memory cells connected to one of said reference digit wiring line have different storage data.

10. A semiconductor memory device comprising:

a memory cell matrix section including memory cells arranged in a first matrix, wherein when one of said memory cells is selected based on an address signal, a read data signal corresponding to a storage data of said selected memory cell is outputted;

a reference memory cell matrix section including reference memory cells arranged in a second matrix, and outputting a reference data signal for said read data signal outputted from said selected memory cell; and a sensing circuit sensing said storage data based on said read data signal from said memory cell matrix section and said reference data signal from said reference memory cell matrix section, wherein said reference memory cell matrix section outputs said reference data signal to said sensing circuit such that said reference data signal appears substantially synchronous with said data read signal, and wherein said reference memory cell matrix section includes:

a plurality of reference digit lines;

a virtual ground line;

a reference memory cell matrix including said reference memory cells arranged in said second matrix, wherein a reference digit wiring line and a reference virtual ground wiring line are alternately provided to extend in a column direction and said reference memory cells of each row are provided between said reference digit wiring line and said reference virtual ground wiring line in a row direction, one of said reference memory cells selected based on said address signal being connected to a first one of said reference digit wiring lines, and remaining ones of said reference memory cells being non-selected reference memory cells;

a selective precharging circuit applying a read bias for a first of said plurality of reference digit lines which is connected to said selected reference memory cell, and applying a reference precharge signal for a second one of said plurality of reference digit lines which is connected with a first one of said non-selected reference memory cells, a value of said reference precharge signal being determined based on said address signal;

a first bank selector transferring said read bias from said first reference digit line to said first reference digit wiring line and said reference precharge signal from said second reference digit line to said second reference digit wiring line based on a first bank selection signal; and a second bank selector connecting said ground voltage to said virtual ground wiring line connected with said selected reference memory cell based on a second bank selection signal, said first and second bank selection signals being determined based on said address signal;

wherein said reference data signal corresponds to a current flowing through said first reference digit line, said first reference digit wiring line, said selected reference memory cell and said virtual ground line, when said read bias is applied to said selected reference memory cell.

11. A semiconductor memory device according to claim 10, wherein two of said reference memory cells connected to one of said reference digit wiring line have different storage data.

12. A semiconductor memory device according to claim 10, wherein said selective charging circuit applies said reference precharge signal for said second reference digit line in response to said first and second bank selection signals.

13. A semiconductor memory device according to claim 10, wherein said selective charging circuit includes a plurality of transistors supplying a plurality of currents as said reference precharge signal based on said address signal.

14. A semiconductor memory device according to claim 13, wherein said plurality of transistors have different current supply capabilities, and each of said plurality of transistors are selectively turned on based on said address signal.

15. A semiconductor memory device according to claim 14, wherein said plurality of transistors have different gate widths.

16. A semiconductor memory device according to claim 14, wherein said plurality of transistors have different gate lengths.

* * * * *